US012787268B2

(12) United States Patent
Chuang

(10) Patent No.: US 12,787,268 B2
(45) Date of Patent: Nov. 3, 2026

(54) MEMORY DEVICE INCLUDING RECESSED GATE STRUCTURE HAVING HIGH-K GATE DIELECTRIC LAYER AND METHOD FOR PREPARING THE SAME

(71) Applicant: NANYA TECHNOLOGY CORPORATION, New Taipei City (TW)

(72) Inventor: Ying-Cheng Chuang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 346 days.

(21) Appl. No.: 18/629,030

(22) Filed: Apr. 8, 2024

(65) Prior Publication Data

US 2025/0287579 A1 Sep. 11, 2025

Related U.S. Application Data

(62) Division of application No. 18/596,957, filed on Mar. 6, 2024.

(51) Int. Cl.
*H10B 12/00* (2023.01)

(52) U.S. Cl.
CPC .................................... *H10B 12/50* (2023.02)

(58) Field of Classification Search
CPC ...................................................... H10B 12/50
USPC ........................................................ 257/296
See application file for complete search history.

(56) References Cited

U.S. PATENT DOCUMENTS

| | | | | |
|---|---|---|---|---|
| 2007/0128846 A1* | 6/2007 | Choi | H10D 64/037 257/E21.21 |
| 2010/0019344 A1* | 1/2010 | Chuang | H10D 1/47 257/516 |
| 2015/0228656 A1 | 8/2015 | Schloesser et al. | |
| 2019/0088756 A1 | 3/2019 | Fang et al. | |
| 2020/0411654 A1 | 12/2020 | Tsai | |

FOREIGN PATENT DOCUMENTS

| | | |
|---|---|---|
| TW | I803371 B | 5/2023 |
| WO | WO2014169506 A1 | 10/2014 |

OTHER PUBLICATIONS

Office Action and and the search report mailed on Feb. 27, 2025 related to Taiwanese Application No. 113113914.

(Continued)

*Primary Examiner* — Xia L Cross
(74) *Attorney, Agent, or Firm* — Xuan Zhang

(57) ABSTRACT

A memory device includes a first high-k gate dielectric layer disposed in a semiconductor substrate. A top surface of the first high-k gate dielectric layer is higher than a top surface of the semiconductor substrate. The memory device also includes a first metal gate electrode layer disposed over the first high-k gate dielectric layer. A lower portion of the first metal gate electrode layer is surrounded by the first high-k gate dielectric layer, and a width of an upper portion of the first metal gate electrode layer is greater than a width of the lower portion of the first metal gate electrode layer. The memory device further includes a first dielectric portion disposed over the first metal gate electrode layer.

13 Claims, 27 Drawing Sheets

(56) References Cited

OTHER PUBLICATIONS

Summary translation of Office Action and and the search report mailed on Feb. 27, 2025 related to Taiwanese Application No. 113113914.
Notice of Allowance dated Apr. 28, 2025 related to Taiwanese Application No. 114100696.

* cited by examiner

MEMORY DEVICE INCLUDING RECESSED GATE STRUCTURE HAVING HIGH-K GATE DIELECTRIC LAYER AND METHOD FOR PREPARING THE SAME

CROSS-REFERENCE TO RELATED APPLICATION

This application is a divisional application of U.S. Non-Provisional application Ser. No. 18/596,957 filed Mar. 6, 2024, which is incorporated herein by reference in its entirety.

TECHNICAL FIELD

The present disclosure relates to a memory device and a method for preparing the same, and more particularly, to a memory device including a recessed gate structure having a high-k gate dielectric layer and a method for preparing the same.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have continuously shrunk so that the packing densities of these DRAMs have increased considerably. However, the manufacturing and integration of memory devices involve many complicated steps and operations. Integration in memory devices becomes increasingly complicated. An increase in complexity of manufacturing and integration of the memory device may cause deficiencies. Accordingly, there is a continuous need to improve the structure and the manufacturing process of memory devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a memory device is provided. The memory device includes a first high-k gate dielectric layer disposed in a semiconductor substrate. A top surface of the first high-k gate dielectric layer is higher than a top surface of the semiconductor substrate. The memory device also includes a first metal gate electrode layer disposed over the first high-k gate dielectric layer. A lower portion of the first metal gate electrode layer is surrounded by the first high-k gate dielectric layer, and a width of an upper portion of the first metal gate electrode layer is greater than a width of the lower portion of the first metal gate electrode layer. The memory device further includes a first dielectric portion disposed over the first metal gate electrode layer.

In an embodiment, the first metal gate electrode layer is in direct contact with the top surface of the first high-k gate dielectric layer. In an embodiment, the first metal gate electrode layer is separated from the semiconductor substrate by the first high-k gate dielectric layer. In an embodiment, the first high-k gate dielectric layer is separated from the first dielectric portion by the first metal gate electrode layer. In an embodiment, the top surface of the semiconductor substrate is higher than a bottom surface of the lower portion of the first metal gate electrode layer. In an embodiment, a top surface of an upper portion of the first metal gate electrode layer is higher than the top surface of the first high-k gate dielectric layer.

In an embodiment, the width of the upper portion of the first metal gate electrode layer is substantially the same as a width of the first high-k gate dielectric layer. In an embodiment, the width of the upper portion of the first metal gate electrode layer is substantially the same as a width of the first dielectric portion. In an embodiment, a sidewall of the first high-k gate dielectric layer is vertically aligned to a sidewall of the upper portion of the first metal gate electrode layer in a cross-sectional view of the memory device. In an embodiment, the sidewall of the upper portion of the first metal gate electrode layer is vertically aligned to a sidewall of the first dielectric portion in the cross-sectional view of the memory device. In an embodiment, the first high-k gate dielectric layer and the first metal gate electrode layer form a recessed gate structure in a peripheral circuit region of the memory device.

In an embodiment, the memory device further includes a second high-k gate dielectric layer disposed over the semiconductor substrate, a second metal gate electrode layer disposed over the second high-k gate dielectric layer, and a second dielectric portion disposed over the second metal gate electrode layer. In an embodiment, the second high-k gate dielectric layer and the second metal gate electrode layer form a planar gate structure in the peripheral circuit region of the memory device. In an embodiment, a sidewall of the second high-k gate dielectric layer is vertically aligned to a sidewall of the second metal gate electrode layer in a cross-sectional view of the memory device. In an embodiment, the sidewall of the second metal gate electrode layer is vertically aligned to a sidewall of the second dielectric portion in the cross-sectional view of the memory device.

In another embodiment of the present disclosure, a memory device is provided. The memory device includes a recessed gate structure disposed in a semiconductor substrate. The recessed gate structure includes a first high-k gate dielectric layer and a first metal gate electrode layer. A top surface of the first high-k gate dielectric layer is higher than a top surface of the semiconductor substrate, and the first metal gate electrode layer extends over the top surface of the first high-k gate dielectric layer. The memory device also includes a planar gate structure disposed over the semiconductor substrate and separated from the recessed gate structure. The planar gate structure includes a second high-k gate dielectric layer and a second metal gate electrode layer disposed over the second high-k gate dielectric layer.

In an embodiment, the recessed gate structure and the planar gate structure are disposed in a peripheral circuit region of the memory device. In an embodiment, the first metal gate electrode layer is in direct contact with the top surface of the first high-k gate dielectric layer. In an embodiment, a material of the first high-k gate dielectric layer is the same as a material of the second high-k gate dielectric layer. In an embodiment, a material of the first metal gate electrode layer is the same as a material of the second metal gate electrode layer. In an embodiment, the first metal gate electrode layer has a lower portion surrounded by the first high-k gate dielectric layer and an upper portion above the top surface of the first high-k gate dielectric layer, wherein a width of the upper portion of the first metal gate electrode layer is greater than a width of the lower portion of the first metal gate electrode layer.

In an embodiment, the width of the upper portion of the first metal gate electrode layer is substantially the same as a width of the first high-k gate dielectric layer. In an embodiment, a sidewall of the first high-k gate dielectric layer is exposed by the semiconductor substrate, and the sidewall of the first high-k gate dielectric layer is vertically aligned to a sidewall of the upper portion of the first metal gate electrode layer in a cross-sectional view of the memory device. In an embodiment, the memory device further includes a first dielectric portion disposed over the recessed gate structure, and a second dielectric portion disposed over the planar gate structure, wherein a material of the first dielectric portion is the same as a material of the second dielectric portion.

In an embodiment, the first dielectric portion is separated from the first high-k gate dielectric layer by the first metal gate electrode layer. In an embodiment, a width of the first dielectric portion is substantially the same as a width of the first metal gate electrode layer above the top surface of the first high-k gate dielectric layer. In an embodiment, a sidewall of the first dielectric portion is vertically aligned to a sidewall of the first metal gate electrode layer in a cross-sectional view of the memory device. In an embodiment, a sidewall of the second high-k gate dielectric layer, a sidewall of the second metal gate electrode layer and a sidewall of the second dielectric portion are vertically aligned in the cross-sectional view of the memory device.

In yet another embodiment of the present disclosure, a method for preparing a memory device is provided. The method includes forming a recess in a semiconductor substrate, and forming a high-k gate dielectric material covering a top surface of the semiconductor substrate and lining the recess. The method also includes forming a metal gate electrode material covering the high-k gate dielectric material, and forming a first dielectric layer covering the metal gate electrode material. The method further includes forming a first patterned photo resist over the first dielectric layer, and etching the high-k gate dielectric material, the metal gate electrode material and the first dielectric layer using the first patterned photo resist as a mask to form a recessed gate structure and a first dielectric portion over the recessed gate structure. The recessed gate structure includes a first high-k gate dielectric layer and a first metal gate electrode layer over the first high-k gate dielectric layer, and a top surface of the first high-k gate dielectric layer is higher than the top surface of the semiconductor substrate.

In an embodiment, a top surface of the first metal gate electrode layer is higher than the top surface of the first high-k gate dielectric layer. In an embodiment, the first metal gate electrode layer has a lower portion surrounded by the first high-k gate dielectric layer and an upper portion above the top surface of the first high-k gate dielectric layer, wherein a width of the upper portion of the first metal gate electrode layer is greater than a width of the lower portion of the first metal gate electrode layer. In an embodiment, a sidewall of the first dielectric portion is vertically aligned to a sidewall of the upper portion of the first metal gate electrode layer in a cross-sectional view of the memory device. In an embodiment, the sidewall of the upper portion of the first metal gate electrode layer is vertically aligned to a sidewall of the first high-k gate dielectric layer in the cross-sectional view of the memory device.

In an embodiment, a planar gate structure and a second dielectric portion over the planar gate structure are formed by the etching. In an embodiment, after the etching, the first dielectric portion is covered by a first portion of the first patterned photo resist, and the second dielectric portion is covered by a second portion of the first patterned photo resist. In an embodiment, before the recess is formed, the method further includes forming a trench in the semiconductor substrate, and forming a gate dielectric layer covering the top surface of the semiconductor substrate and lining the trench. In addition, before the recess is formed, the method includes forming a gate electrode layer in the trench and over the gate dielectric layer, and forming a dielectric cap layer over the gate electrode layer, wherein a remaining portion of the trench over the gate electrode layer is filled by the dielectric cap layer. In an embodiment, the recess is formed in a peripheral circuit region of the memory device, and the trench is formed in an array region of the memory device.

In an embodiment, before the recess is formed, the method further includes forming a second patterned photo resist over the dielectric cap layer, and forming a second dielectric layer over the dielectric cap layer and covering the second patterned photo resist. In addition, before the recess is formed, the method includes forming an underlayer covering the second dielectric layer, and etching the underlayer to expose the second dielectric layer. In an embodiment, before the underlayer is formed, the method further includes partially removing the second dielectric layer to expose the dielectric cap layer and the second patterned photo resist. In an embodiment, after the underlayer is etched, the method further includes etching the second dielectric layer, the dielectric cap layer and the gate dielectric layer to form an opening exposing the top surface of the semiconductor substrate, and etching the semiconductor substrate through the opening to form the recess.

Embodiments of a memory device and method for preparing the same are provided in the disclosure. In some embodiments, the memory device includes a high-k gate dielectric layer disposed in a semiconductor substrate, and a metal gate electrode layer disposed over the high-k gate dielectric layer. In some embodiments, a top surface of the high-k gate dielectric layer is higher than a top surface of the semiconductor substrate. Moreover, a lower portion of the metal gate electrode layer is surrounded by the high-k gate dielectric layer, and a width of an upper portion of the metal gate electrode layer is greater than a width of the lower portion of the metal gate electrode layer. Therefore, gate-to-substrate leakage current can be reduced. In addition, since the high-k gate dielectric layer and the metal gate electrode layer form a recessed gate structure in a peripheral circuit region, and a planar gate structure is formed simultaneously in the peripheral circuit region, the drive current of the memory device may be increased. As a result, the performance of the memory device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
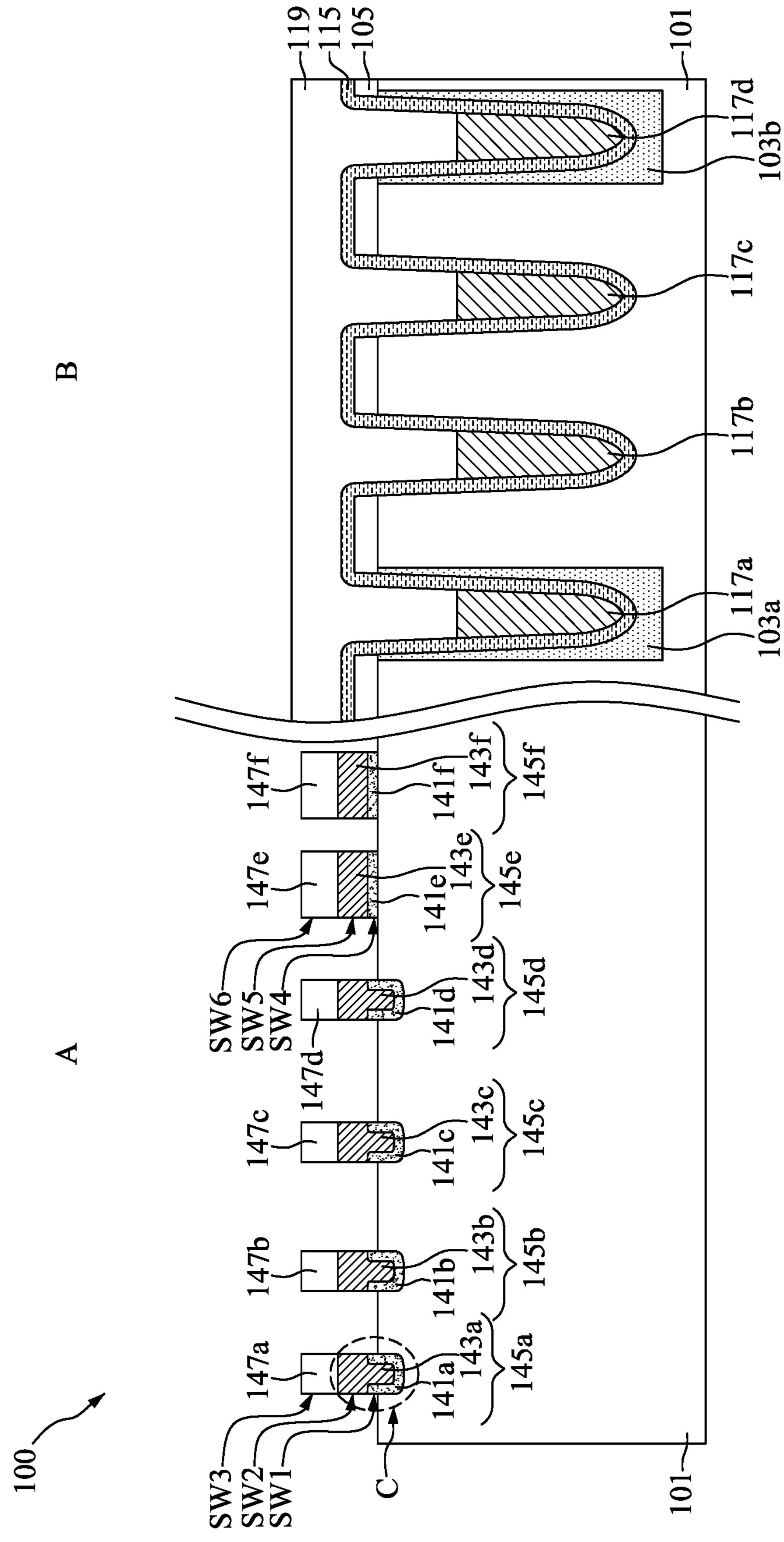
FIG. 1 is a cross-sectional view illustrating a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
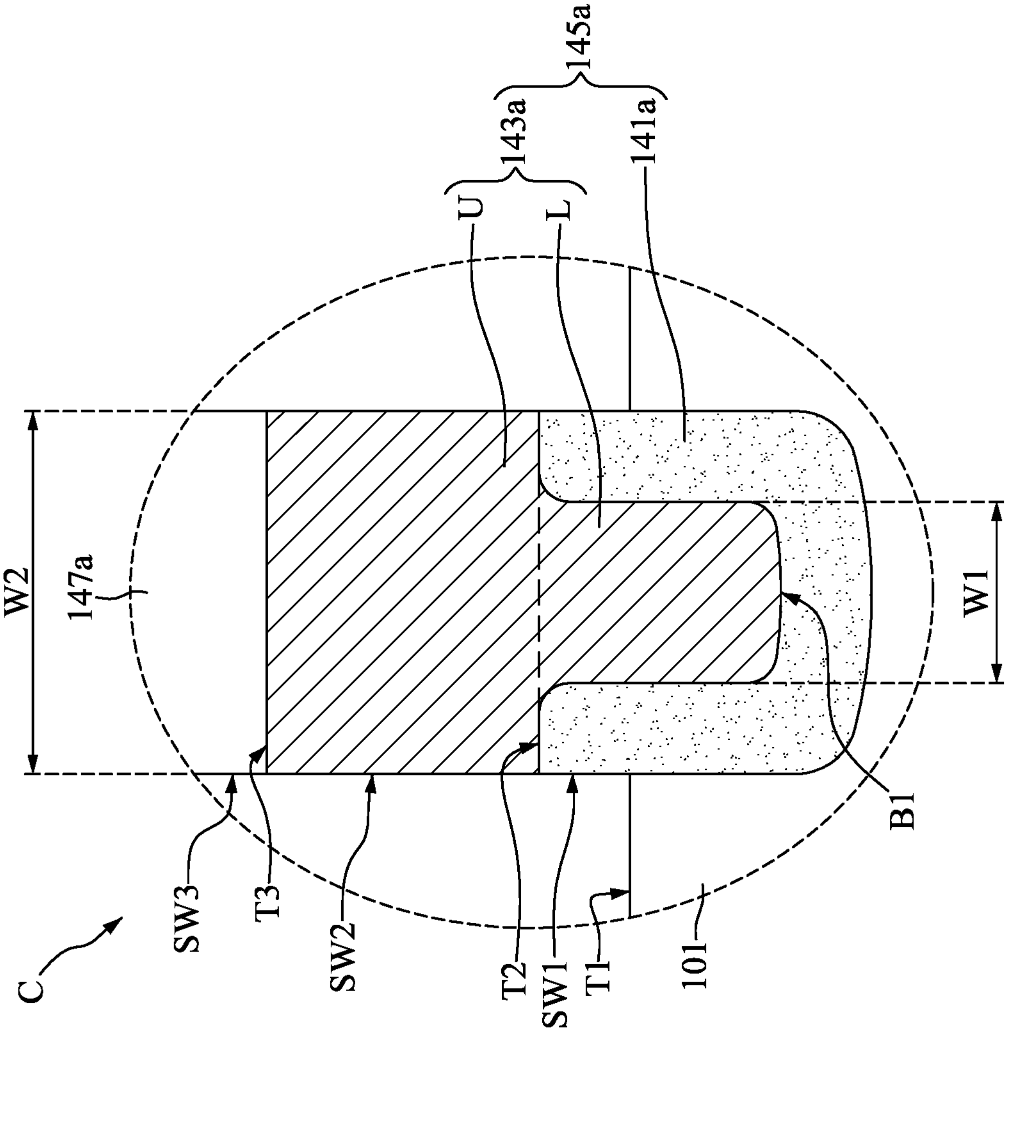
FIG. 2 is an enlarged view of a portion of the memory device in FIG. 1, in accordance with some embodiments.

FIG. 1 is a cross-sectional view illustrating a memory device 100, in accordance with some embodiments. FIG. 2 is an enlarged view of a portion C of the memory device 100 in FIG. 1, in accordance with some embodiments.

As shown in FIG. 1, the memory device 100 includes a peripheral circuit region A and an array region B, in accordance with some embodiments. In some embodiments, the memory device 100 includes a semiconductor substrate 101, a plurality of recessed gate structures 145*a*, 145*b*, 145*c* and 145*d* disposed in the semiconductor substrate 101, and a plurality of planar gate structures 145*e* and 145*f* are disposed over the semiconductor substrate 101. The recessed gate structures 145*a*, 145*b*, 145*c* and 145*d* and the planar gate structures 145*e* and 145*f* are disposed in the peripheral circuit region A.

In some embodiments, the recessed gate structures 145*a*, 145*b*, 145*c* and 145*d* and the planar gate structures 145*e* and 145*f* are separated from each other. In some embodiments, the recessed gate structure 145*a* includes a high-k gate dielectric layer 141*a* and a metal gate electrode layer 143*a* disposed over the high-k gate dielectric layer 141*a*. In some embodiments, the memory device 100 includes a dielectric portion 147*a* disposed over the metal gate electrode layer 143*a* of the recessed gate structure 145*a*.

Similarly, in some embodiments, the recessed gate structure 145*b* includes a high-k gate dielectric layer 141*b* and a metal gate electrode layer 143*b* disposed over the high-k gate dielectric layer 141*b*, the recessed gate structure 145*c* includes a high-k gate dielectric layer 141*c* and a metal gate electrode layer 143*c* disposed over the high-k gate dielectric layer 141*c*, and the recessed gate structure 145*d* includes a high-k gate dielectric layer 141*d* and a metal gate electrode layer 143*d* disposed over the high-k gate dielectric layer 141*d*. In some embodiments, the memory device 100 includes dielectric portions 147*b*, 147*c* and 147*d* disposed over the metal gate electrode layers 143*b*, 143*c* and 143*d* of the recessed gate structures 145*b*, 145*c* and 145*d*, respectively.

As shown in FIG. 2, the high-k gate dielectric layer 141*a* of the recessed gate structure 145*a* has a top surface T2 higher than the top surface T1 of the semiconductor substrate, in accordance with some embodiments. Moreover, the metal gate electrode layer 143*a* includes a lower portion L surrounded by the high-k gate dielectric layer 141*a*, and an upper portion U above the top surface T2 of the high-k gate dielectric layer 141*a*. In some embodiments, the top surface T1 of the semiconductor substrate 101 is higher than a bottom surface B1 of the lower portion L of the first metal gate electrode layer 143*a*.

In some embodiments, the upper portion U of the metal gate electrode layer 143*a* is in direct contact with the top surface T2 of the high-k gate dielectric layer 141*a*, and a top surface T3 of the upper portion U of the metal gate electrode layer 143*a* is higher than the top surface T2 of the high-k gate dielectric layer 141*a* and the top surface T1 of the semiconductor substrate 101. In some embodiments, a width W2 of the upper portion U of the metal gate electrode layer 143*a* is greater than a width W1 of the lower portion L of the metal gate electrode layer 143*a*.

In addition, a sidewall SW1 of the high-k gate dielectric layer 141*a*, a sidewall SW2 of the upper portion U of the metal gate electrode layer 143*a*, and a sidewall SW3 of the dielectric portion 147*a* are vertically aligned in the cross-sectional view of the memory device 100, as shown in FIGS. 1 and 2 in accordance with some embodiments. Similar features also present in the recessed gate structures 145*b*, 145*c* and 145*d*, and are not repeated herein.

In some embodiments, the planar gate structure 145*e* includes a high-k gate dielectric layer 141*e* disposed over the semiconductor substrate 101 and a metal gate electrode layer 143*e* disposed over the high-k gate dielectric layer 141*e*, and the planar gate structure 145*f* includes a high-k gate dielectric layer 141*f* disposed over the semiconductor substrate 101 and a metal gate electrode layer 143*f* disposed over the high-k gate dielectric layer 141*f*. In some embodiments, the memory device 100 includes dielectric portions 147*e* and 147*f* disposed over the metal gate electrode layers 143*e* and 143*f* of the planar gate structures 145*e* and 145*f*, respectively. In some embodiments, a sidewall SW4 of the high-k gate dielectric layer 141*e*, a sidewall SW5 of the metal gate electrode layer 143*e*, and a sidewall SW6 of the dielectric portion 147*e* are vertically aligned in the cross-sectional view of the memory device 100. Similar features also present in the planar gate structure 145*f*, and are not repeated herein.

In the array region B, the memory device 100 includes isolation structures 103*a* and 103*b* disposed in the semiconductor substrate 101 defining an active area between them, a mask layer 105 disposed over the semiconductor substrate 101, and a plurality of gate electrodes 117*a*, 117*b*, 117*c* and 117*d* disposed in the semiconductor substrate 101. In some embodiments, the gate electrode 117*a* is disposed in the isolation structure 103*a*, the gate electrodes 117*b* and 117*c* are disposed in the active area between the isolation structures 103*a* and 103*b*, and the gate electrode 117*d* is disposed in the isolation structure 103*b*.

Moreover, in the array region B, the memory device 100 includes a gate dielectric layer 115 covering the mask layer 105 and extending into the semiconductor substrate 101 to surround the gate electrodes 117*a*, 117*b*, 117*c* and 117*d*, and a dielectric cap layer 119 disposed over the gate dielectric layer 115 and extending into the semiconductor substrate 101 to cover the gate electrodes 117*a*, 117*b*, 117*c* and 117*d*, in accordance with some embodiments. In some embodiments, the memory device 100 is part of a DRAM.

Embodiments of the memory device 100 and method for preparing the same are provided in the disclosure. In some embodiments, the memory device 100 includes the recessed gate structures 145*a*, 145*b*, 145*c* and 145*d*, and the planar gate structures 145*e* and 145*f* in the peripheral circuit region A. In some embodiments, the recessed gate structures 145*a*, 145*b*, 145*c* and 145*d* include the high-k gate dielectric layers 141*a*, 141*b*, 141*c* and 141*d* disposed in the semiconductor substrate 101, and the metal gate electrode layers 143*a*, 143*b*, 143*c* and 143*d* disposed over the high-k gate dielectric layers 141*a*, 141*b*, 141*c* and 141*d*. Therefore, gate-to-substrate leakage current can be reduced.

In addition, the planar gate structures 145*e*, 145*f* and the recessed gate structures 145*a*, 145*b*, 145*c*, 145*d* are formed simultaneously in the peripheral circuit region A, the drive current of the memory device 100 may be increased. As a result, the performance of the memory device may be improved.

Figure 3:
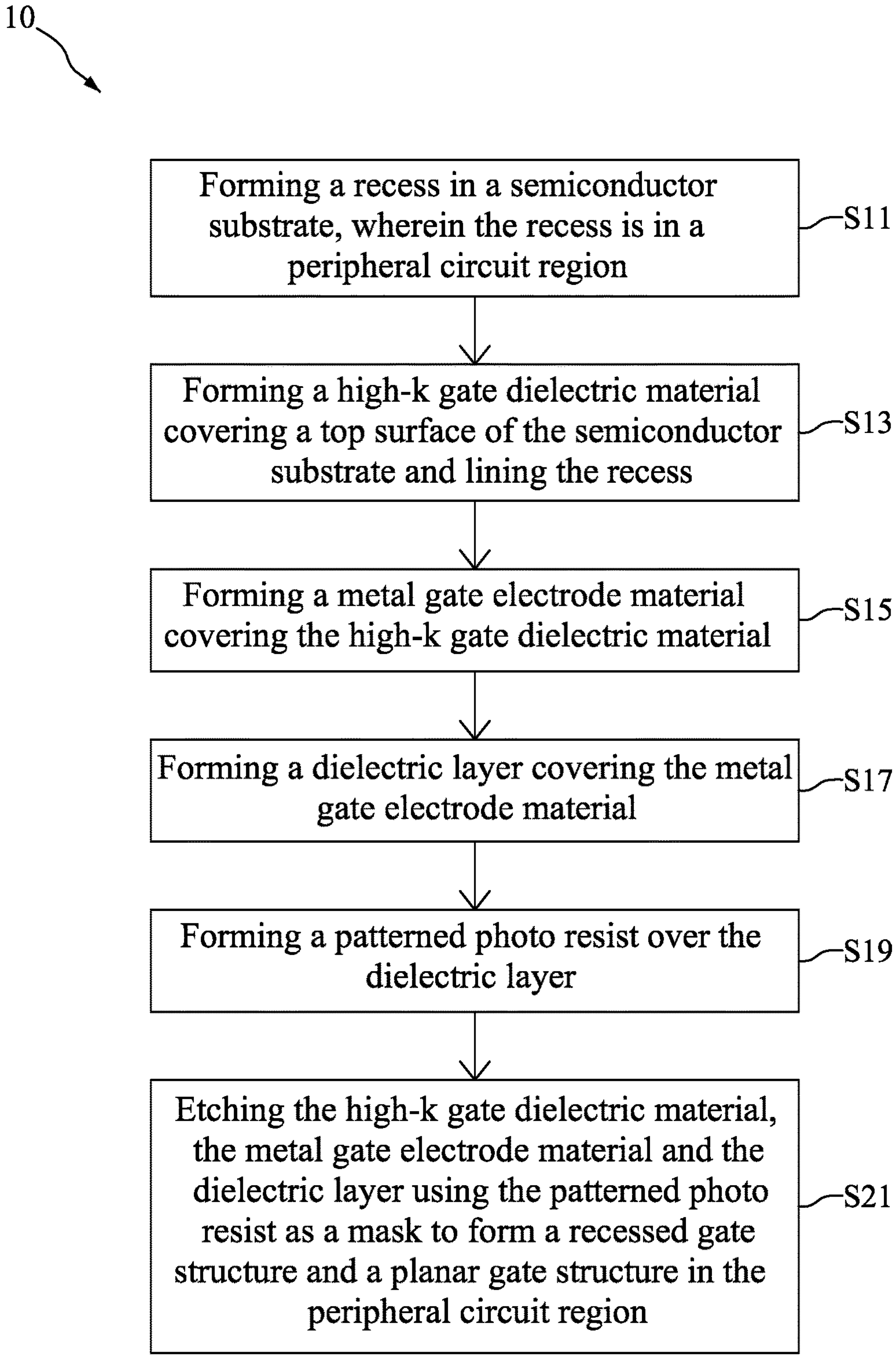
FIG. 3 is a flow diagram illustrating a method for preparing a memory device, in accordance with some embodiments.

FIG. 3 is a flow diagram illustrating a method 10 for preparing the memory device 100, and the method 10 includes steps S11, S13, S15, S17, S19 and S21, in accordance with some embodiments. The steps S11 to S21 of FIG. 3 are elaborated in connection with the following figures.

Figure 4:
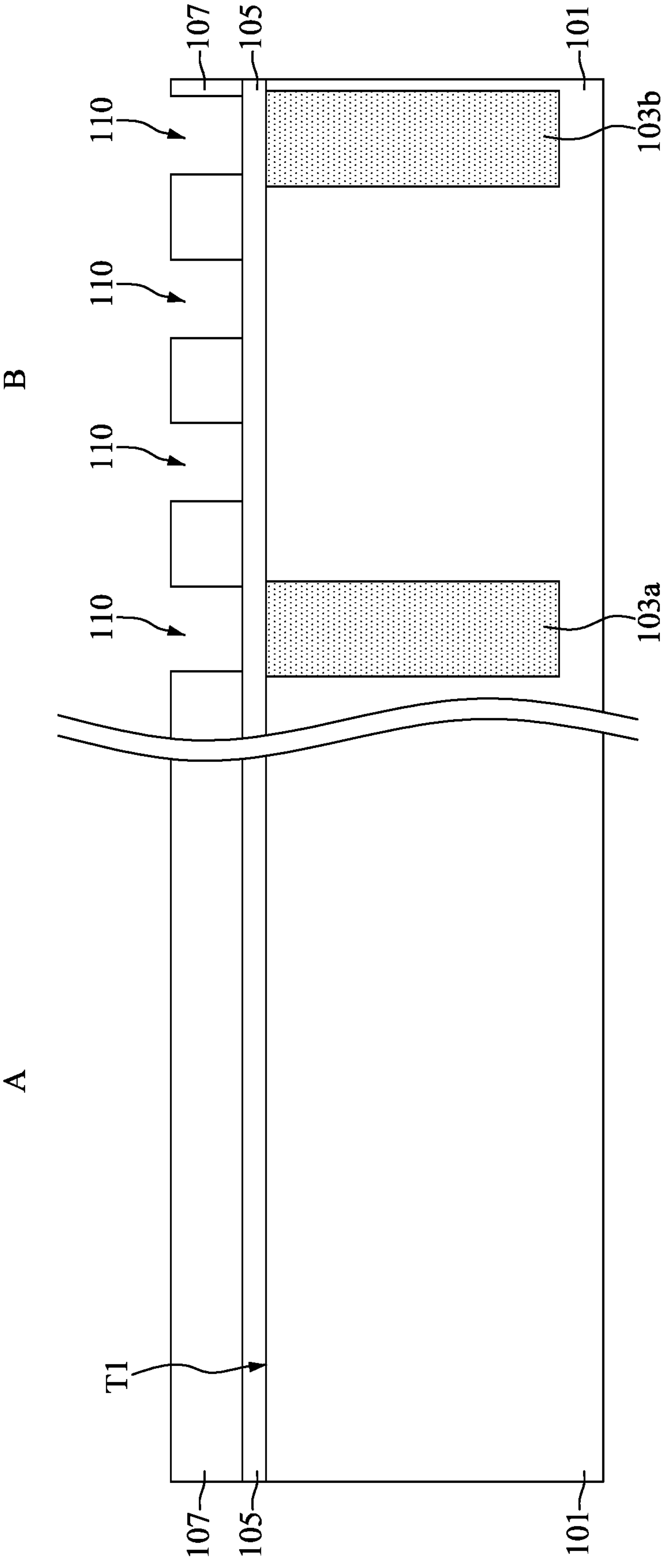
FIG. 4 is a cross-sectional view illustrating an intermediate stage of forming a patterned mask over a top surface of a semiconductor substrate during the formation of the memory device, in accordance with some embodiments.

FIGS. 4 to 21 are cross-sectional views illustrating intermediate stages in the formation of the memory device 100, in accordance with some embodiments. As shown in FIG. 4, a semiconductor substrate 101 is provided.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Still referring to FIG. 4, isolation structures 103*a* and 103*b* are formed in the semiconductor substrate 101 to define an active area in the array region B, and the isolation structures 103*a* and 103*b* are shallow trench isolation (STI) structures, in accordance with some embodiments. In addition, the isolation structures 103*a* and 103*b* may include silicon oxide, silicon nitride, silicon oxynitride or another suitable dielectric material.

The formation of the isolation structures 103*a* and 103*b* may include forming a patterned mask (not shown) over the top surface T1 of the semiconductor substrate 101, etching the semiconductor substrate 101 to form openings (not shown) by using the patterned mask as a mask, depositing a dielectric material in the openings and over the top surface T1 of the semiconductor substrate 101, and planarizing the dielectric material until the top surface T1 of the semiconductor substrate 101 is exposed.

Moreover, a plurality of doped regions (not shown) may be formed in the active area defined by the isolation structures 103*a* and 103*b*, and the doped regions will become the source/drain regions in the array region B of the memory device 100. Then, a mask layer 105 is formed over the top surface T1 of the semiconductor substrate 101, as shown in FIG. 4 in accordance with some embodiments.

In some embodiments, the mask layer 105 is formed in the peripheral circuit region A and the array region B. In some embodiments, the isolation structures 103*a*, 103*b* and the active area in the array region B are covered by the mask layer 105. Next, a patterned mask 107 with openings 110 is formed over the mask layer 105, in accordance with some embodiments. In some embodiments, the openings 110 are in the array region B, and the portion of the mask layer 105 in the array region B is partially exposed by the openings 110 of the patterned mask 107.

In some embodiments, the mask layer 105 includes silicon nitride, silicon oxide, silicon oxynitride, another suitable material, or a combination thereof. In some embodiments, the mask layer 105 and the patterned mask 107 include different materials so that the etching selectivities may be different in the subsequent etching process. In some embodiments, the mask layer 105 is formed by a deposition process, such as a chemical vapor deposition (CVD) process, a physical vapor deposition (PVD) process, an atomic layer deposition (ALD) process, a spin-on coating process, or another suitable deposition process.

Figure 5:
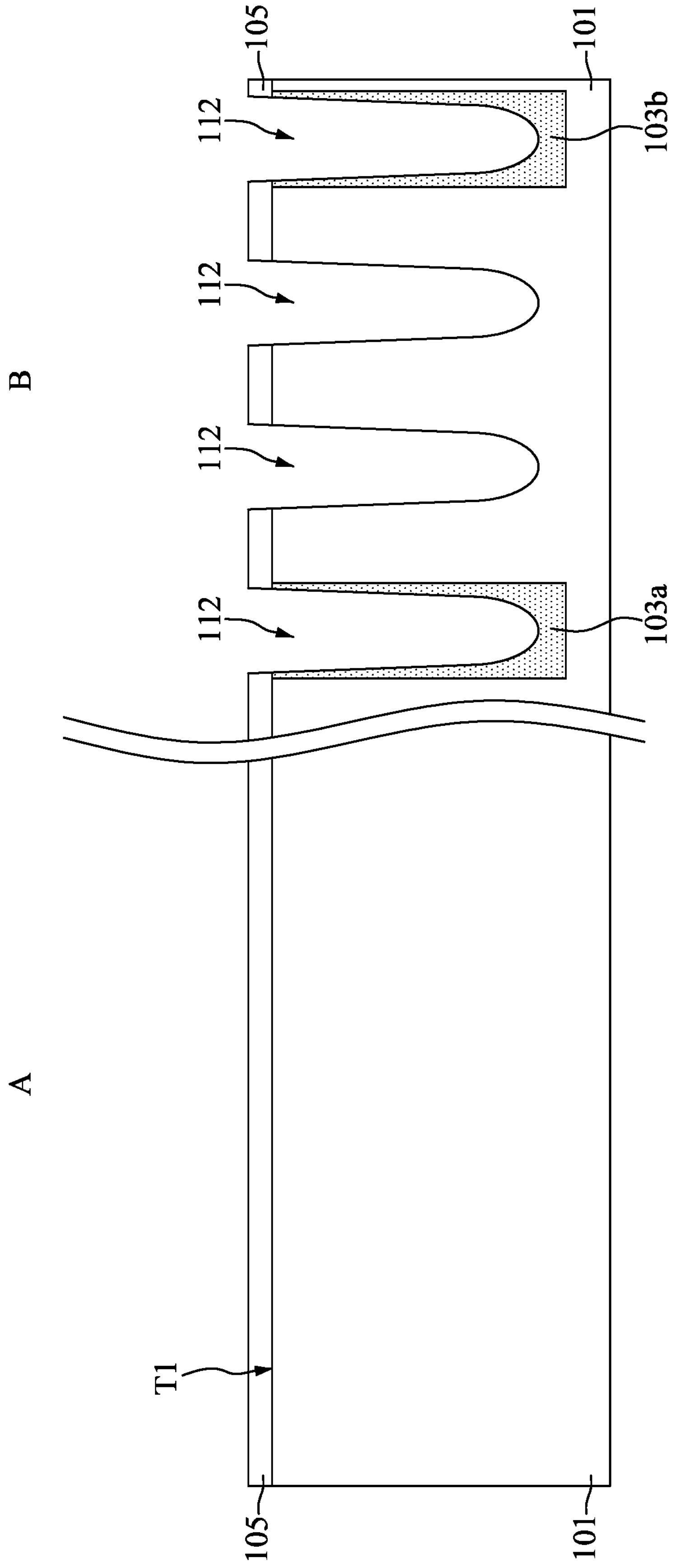
FIG. 5 is a cross-sectional view illustrating an intermediate stage of etching the semiconductor substrate to form trenches in an array region during the formation of the memory device, in accordance with some embodiments.

Subsequently, the mask layer 105 and the semiconductor substrate 101 are etched to form a plurality of trenches 112 by using the patterned mask 107 as an etching mask, as shown in FIG. 5 in accordance with some embodiments. The trenches 112 may extend across doped regions in the active area to form source/drain regions (not shown). In some embodiments, the trenches 112 are formed by a wet etching process, a dry etching process, or a combination thereof. After the trenches 112 are formed, the pattered mask 107 may be removed. In some embodiments, the patterned mask 107 is removed by a stripping process, an ashing process, an etching process, or another suitable process.

Figure 6:
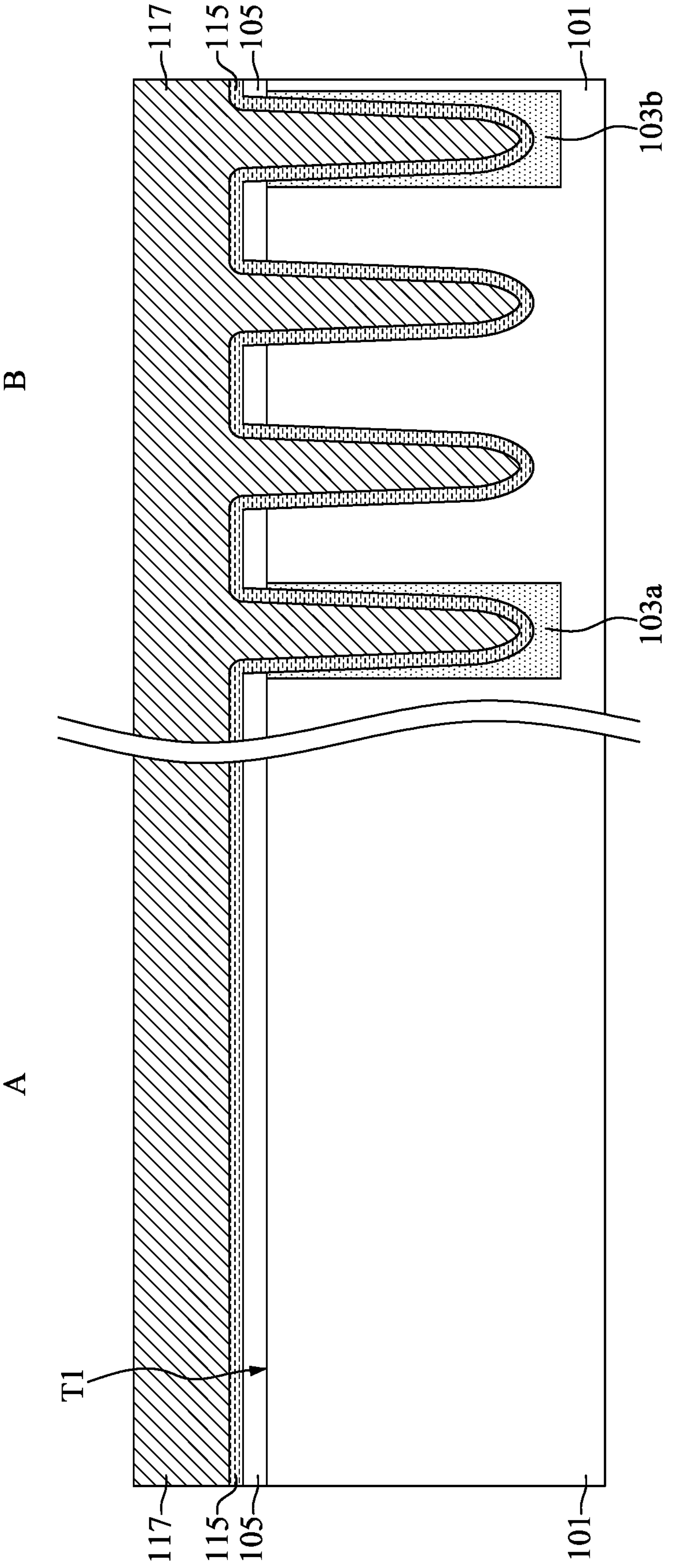
FIG. 6 is a cross-sectional view illustrating an intermediate stage of sequentially forming a gate dielectric layer and a gate electrode layer in the trenches and over the top surface of the semiconductor substrate during the formation of the memory device, in accordance with some embodiments.

Next, a gate dielectric layer 115 is formed lining the trenches 112 and over the mask layer 105 (i.e., over the top surface T1 of the semiconductor substrate 101), and a gate electrode layer 117 is formed over the gate dielectric layer 115, as shown in FIG. 6 in accordance with some embodiments. In some embodiments, after the gate dielectric layer 115 is formed, the remaining portions of the trenches 112 are filled by the gate electrode layer 117 in the subsequent process. In some embodiments, the gate dielectric layer 115 and the gate electrode layer 117 extend to cover the mask layer 105 in the peripheral circuit region A.

In some embodiments, the gate dielectric layer 115 includes silicon oxide, silicon nitride, silicon oxynitride, a dielectric material with high dielectric constant (high-k), or a combination thereof. In some embodiments, the gate electrode layer 117 includes a conductive material such as aluminum (Al), copper (Cu), tungsten (W), titanium (Ti), tantalum (Ta), or may be a multi-layer structure including any combination of the above materials. In some embodiments, the gate dielectric layer 115 is formed by a deposition process, such as a CVD process, a PVD process, an ALD process, a spin-on coating process, or another suitable deposition process. In addition, the gate electrode layer 117 is formed by a deposition process, such as a CVD process, a PVD process, a sputtering process, a plating process, or another suitable deposition process, in accordance with some embodiments.

Figure 7:
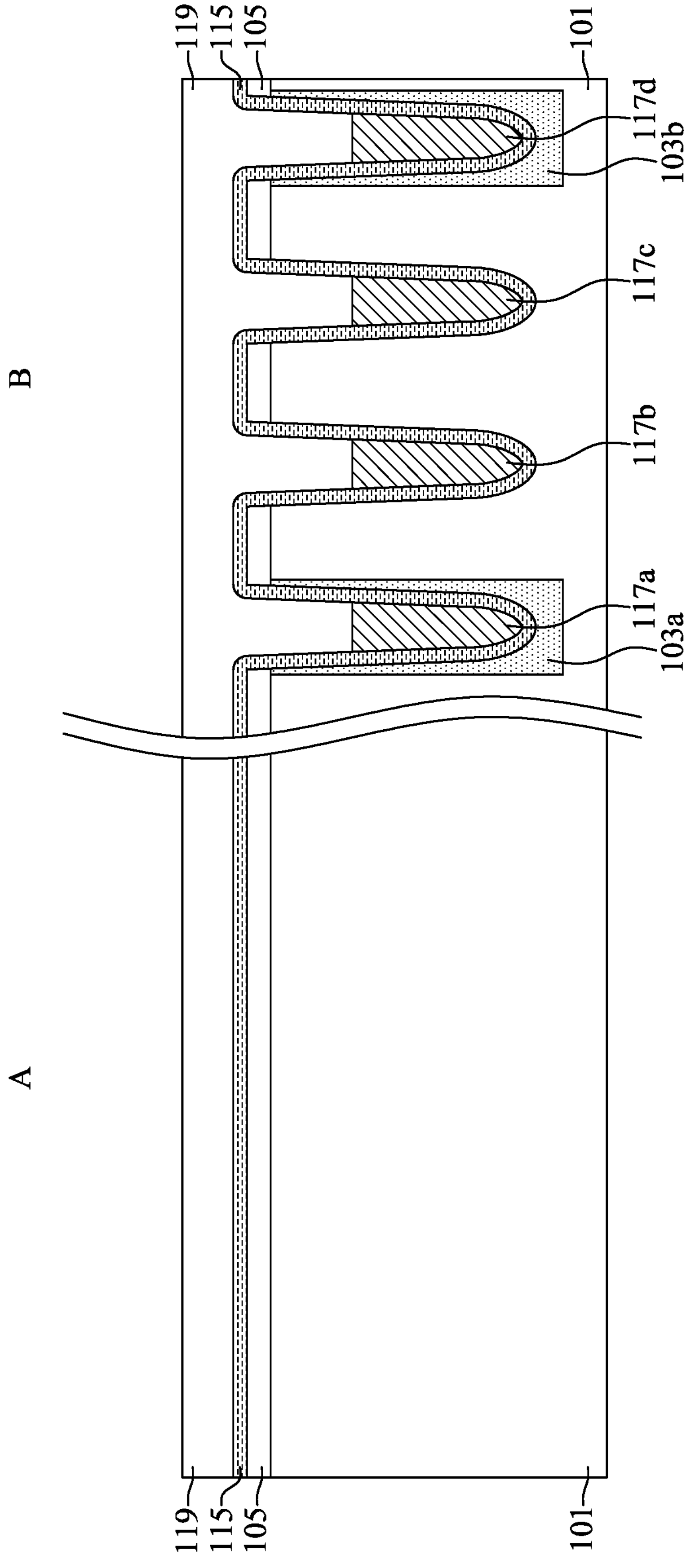
FIG. 7 is a cross-sectional view illustrating an intermediate stage of recessing the gate electrode layer and forming a dielectric cap layer in the trenches and over the top surface of the semiconductor substrate during the formation of the memory device, in accordance with some embodiments.

Subsequently, the gate electrode layer 117 is recessed to form a plurality of gate electrodes 117*a*, 117*b*, 117*c* and 117*d* in the trenches 112 (see FIG. 5), and a dielectric cap layer 119 is formed over the gate dielectric layer 115 and the gate electrodes 117*a*, 117*b*, 117*c* and 117*d*, as shown in FIG. 7 in accordance with some embodiments. In some embodiments, the gate electrode layer 117 is partially removed by performing an etching process. The etching process may be a wet etching process, a dry etching process, or a combination thereof.

After the gate electrode layer 117 is partially removed, the remaining portions of the trenches 112 over the gate electrodes 117*a*, 117*b*, 117*c* and 117*d* are filled by the dielectric cap layer 119, in accordance with some embodiments. In some embodiments, the dielectric cap layer 119 extends to cover the gate dielectric layer 115 in the peripheral circuit region A. In some embodiments, the dielectric cap layer 119 includes silicon oxide, silicon nitride, silicon oxynitride or another suitable dielectric material. In some embodiments, the dielectric cap layer 119 is formed by a deposition process, such as a CVD process, a PVD process, an ALD process, a spin-on coating process, or another suitable deposition process.

Figure 8:
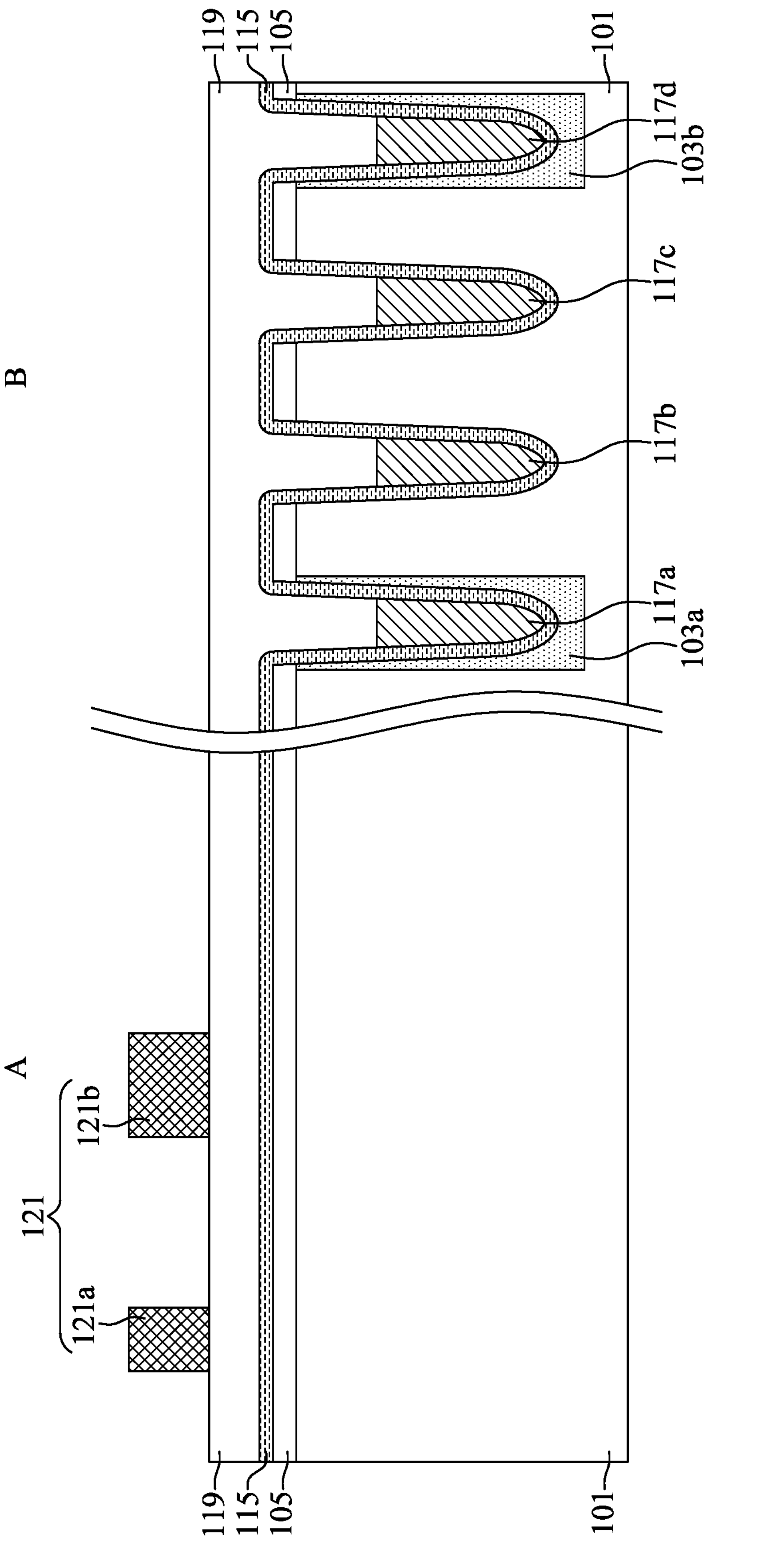
FIG. 8 is a cross-sectional view illustrating an intermediate stage of forming a patterned photo resist over the dielectric cap layer in a peripheral circuit region during the formation of the memory device, in accordance with some embodiments.

Then, a patterned photo resist 121 is formed over the dielectric cap layer 119 in the peripheral circuit region A, as shown in FIG. 8 in accordance with some embodiments. In some embodiments, the patterned photo resist 121 includes portions 121*a* and 121*b*, and the portions 121*a* and 121*b* are separated from each other.

Figure 9:
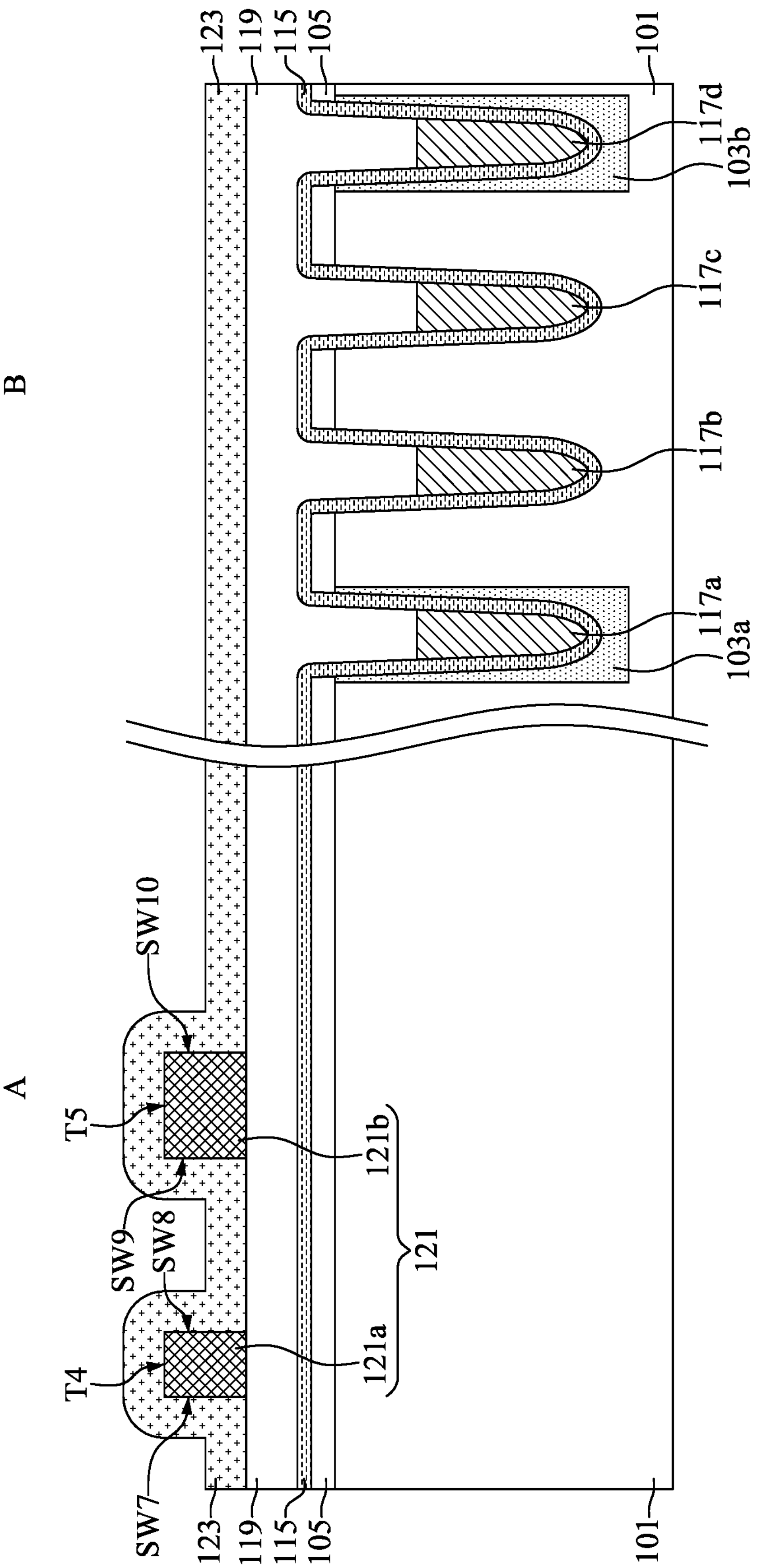
FIG. 9 is a cross-sectional view illustrating an intermediate stage of forming a dielectric layer covering the patterned photo resist and the dielectric cap layer during the formation of the memory device, in accordance with some embodiments.

Next, a dielectric layer 123 is formed over the dielectric cap layer 119 and covering the patterned photo resist 121, as shown in FIG. 9 in accordance with some embodiments. In some embodiments, the top surface T4 and opposite sidewalls SW7 and SW8 of the portion 121*a* of the patterned photo resist 121 are covered by the dielectric layer 123. In some embodiments, the top surface T5 and opposite sidewalls SW9 and SW10 of the portion 121*b* of the patterned photo resist 121 are covered by the dielectric layer 123. In some embodiments, the dielectric layer 123 extends to cover the dielectric cap layer 119 in the array region B.

In some embodiments, the dielectric layer 123 includes silicon oxide. However, any other suitable dielectric materials may be utilized, such as silicon nitride, silicon oxynitride, or another suitable dielectric material. In some embodiments, the dielectric layer 123 is formed by a CVD process, a PVD process, a spin-on coating process, another suitable process, or a combination thereof.

Figure 10:
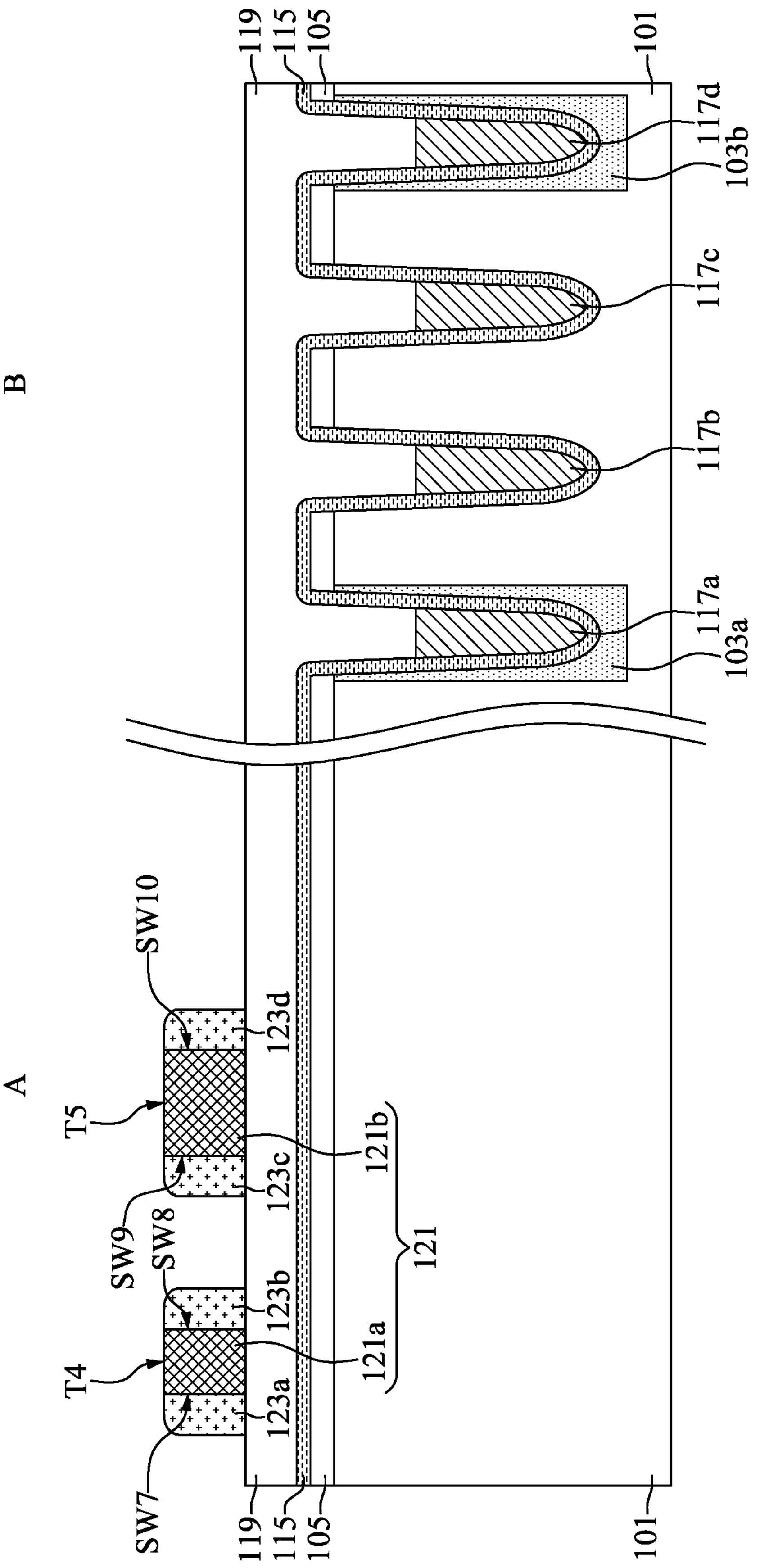
FIG. 10 is a cross-sectional view illustrating an intermediate stage of etching the dielectric layer to form dielectric spacers on sidewalls of the patterned photo resist during the formation of the memory device, in accordance with some embodiments.

Subsequently, the dielectric layer 123 is partially removed by an etching process to form dielectric spacers 123*a*, 123*b*, 123*c* and 123*d*, as shown in FIG. 10 in accordance with some embodiments. In some embodiments, the etching process includes a wet etching process, a dry etching process, or a combination thereof. After the etching process is performed, the top surfaces T4 and T5 of the patterned photo resist 121 are exposed, and the remaining portions of the dielectric layer 123 form the dielectric spacers 123*a*, 123*b*, 123*c* and 123*d* on the sidewalls SW7, SW8, SW9, SW10 of the portions 121*a* and 121*b* of the patterned photo resist 121, in accordance with some embodiments. In some embodiments, after the etching process, the top surface of the dielectric cap layer 119 is partially exposed.

Figure 11:
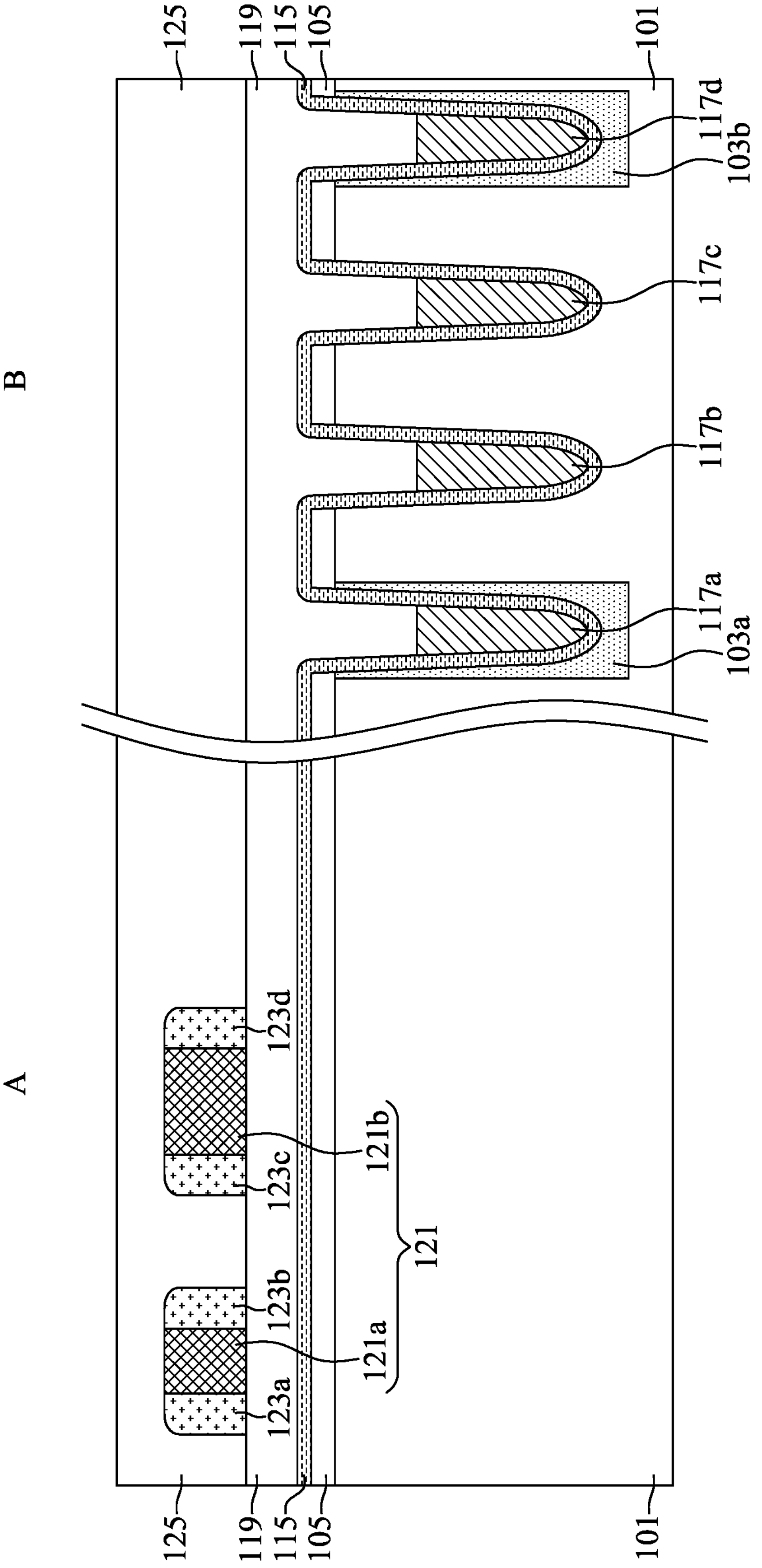
FIG. 11 is a cross-sectional view illustrating an intermediate stage of forming an underlayer covering the patterned photo resist and the dielectric spacers during the formation of the memory device, in accordance with some embodiments.

Then, an underlayer 125 is formed over the dielectric cap layer 119 and covering the portions 121*a*, 121*b* of the patterned photo resist 121 and the dielectric spacers 123*a*, 123*b*, 123*c*, 123*d*, as shown in FIG. 11 in accordance with some embodiments. In some embodiments, the underlayer 125 extends to cover the dielectric cap layer 119 in the array region B. In some embodiments, the underlayer 125 includes an organic material for gap fill and uniformity. In some embodiments, the underlayer 125 includes a photoresist material. In some embodiments, the underlayer 125 is formed by a deposition process, such as a CVD process, a PVD process, an ALD process, a spin-on coating process, or another suitable deposition process.

Figure 12:
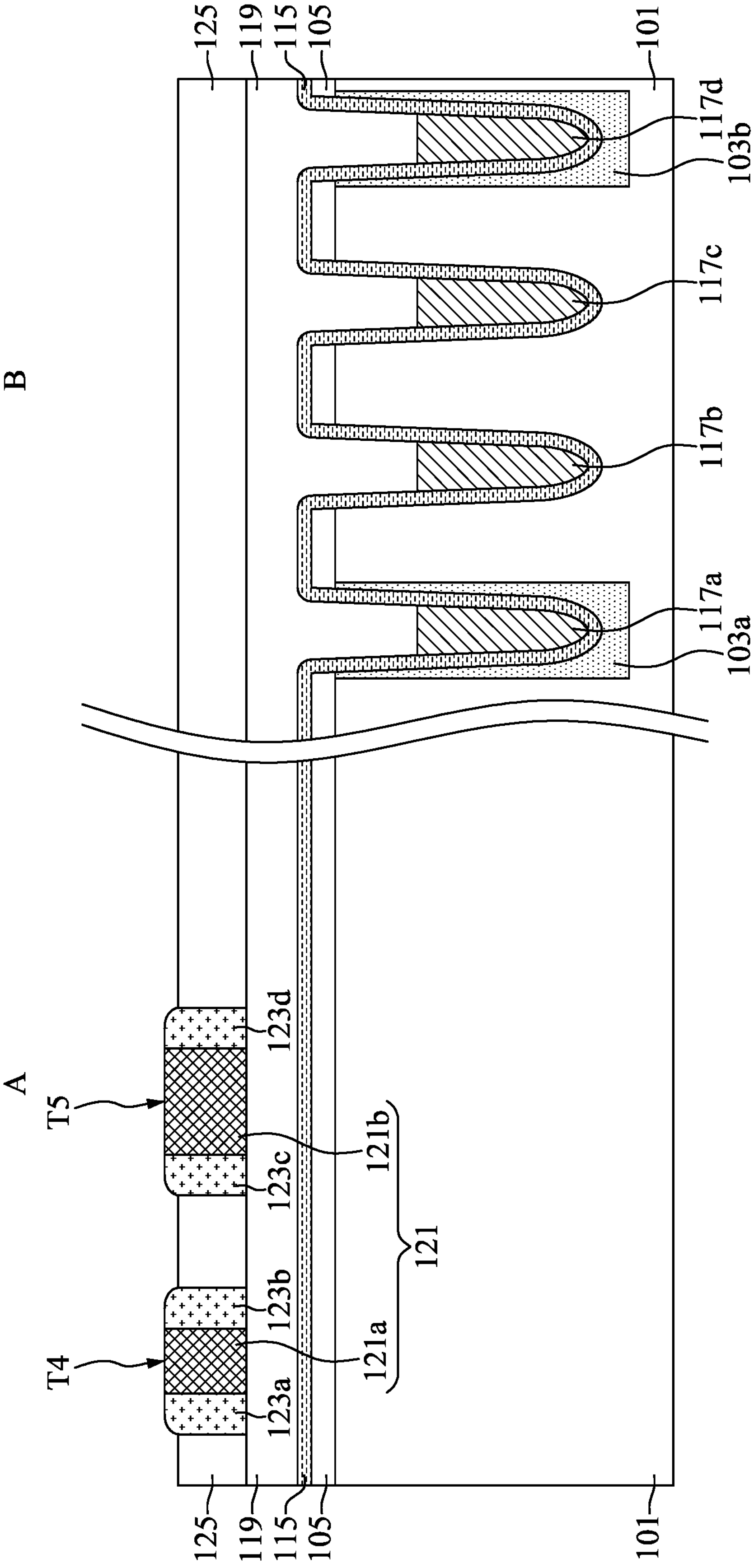
FIG. 12 is a cross-sectional view illustrating an intermediate stage of etching the underlayer to expose the patterned photo resist and the dielectric spacers during the formation of the memory device, in accordance with some embodiments.

Next, the underlayer 125 is partially removed by an etch back process to expose the dielectric spacers 123*a*, 123*b*, 123*c* and 123*d*, as shown in FIG. 12 in accordance with some embodiments. In some embodiments, the etch back process includes a wet etching process, a dry etching process, or a combination thereof. In some embodiments, the underlayer 125 is etched until the dielectric spacers 123*a*, 123*b*, 123*c*, 123*d* and the portions 121*a*, 121*b* of the patterned photo resist 121 are exposed. In some embodiments, the top surfaces T4 and T5 of the portions 121*a* and 121*b* of the patterned photo resist 121 are exposed after the partial removal of the underlayer 125.

Figure 13:
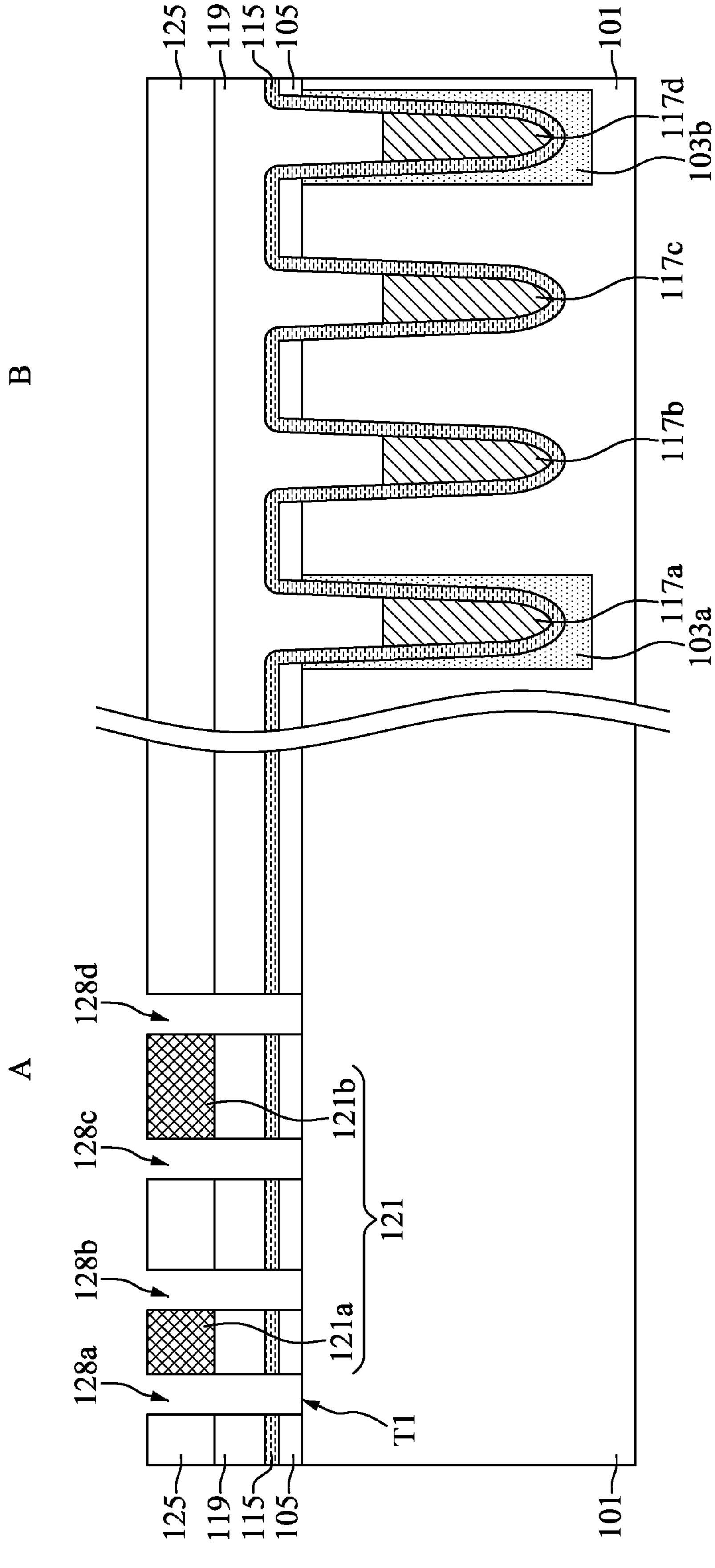
FIG. 13 is a cross-sectional view illustrating an intermediate stage of etching the dielectric spacers and the underlying layers to expose the semiconductor substrate during the formation of the memory device, in accordance with some embodiments.

Subsequently, an etching process is performed to form openings 128*a*, 128*b*, 128*c* and 128*d* in the peripheral circuit region A, as shown in FIG. 13 in accordance with some embodiments. In some embodiments, the etching process includes a wet etching process, a dry etching process, or a combination thereof. In some embodiments, the dielectric spacers 123*a*, 123*b*, 123*c* and 123*d* are removed in the etching process, and the dielectric cap layer 119, the gate dielectric layer 115 and the mask layer 105 are partially removed by the etching process. In some embodiments, the top surface T1 of the semiconductor substrate 101 is partially exposed by the openings 128*a*, 128*b*, 128*c* and 128*d* in the peripheral circuit region A.

Figure 14:
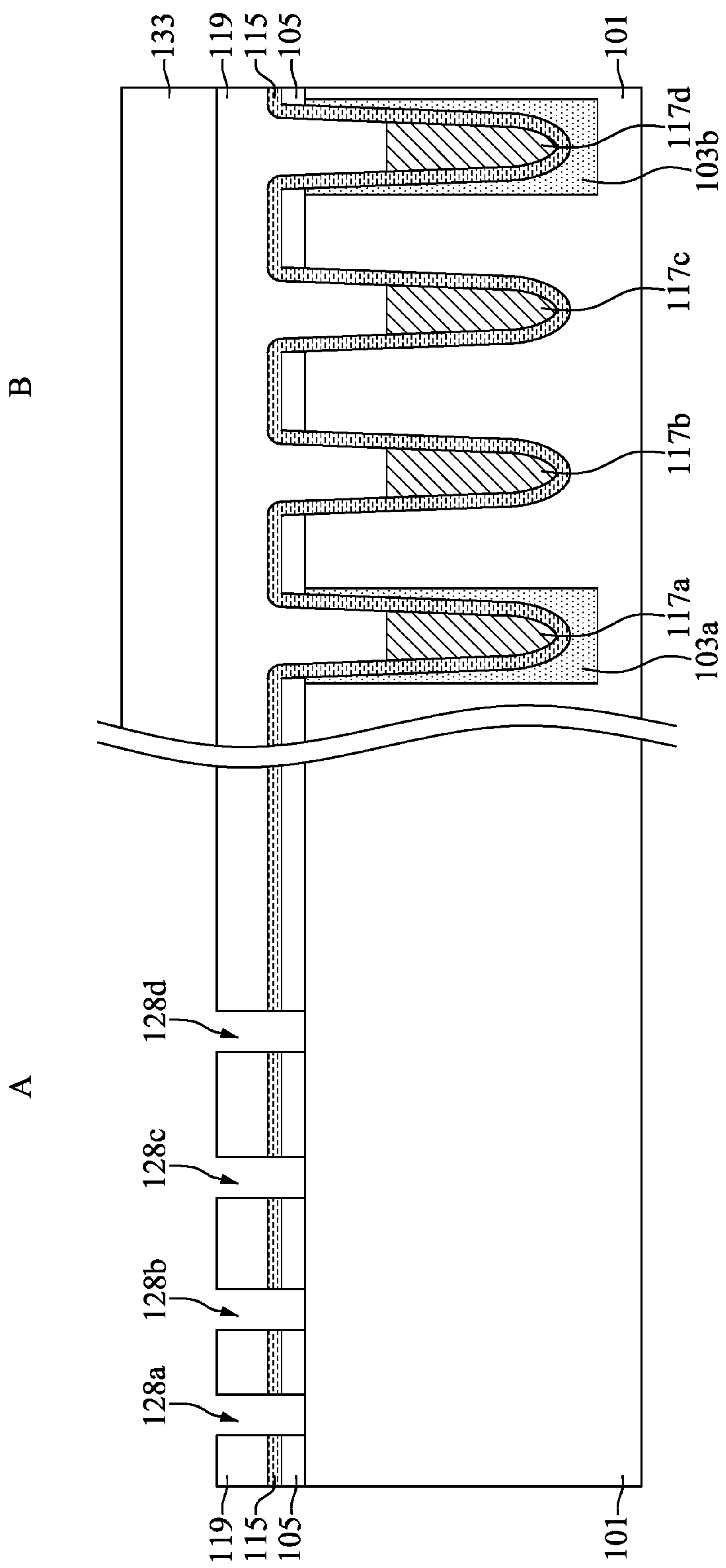
FIG. 14 is a cross-sectional view illustrating an intermediate stage of removing the underlayer and the patterned photo resist during the formation of the memory device, in accordance with some embodiments.

Then, the portions 121*a*, 121*b* of the patterned photo resist 121 and the underlayer 125 are removed (see FIG. 13), and a patterned photo resist 133 is formed to cover the array region B, as shown in FIG. 14 in accordance with some embodiments. In some embodiments, the patterned photo resist 121 and the underlayer 125 are removed by a stripping process, an ashing process, an etching process, or another suitable process. In some embodiments, the patterned photo resist 133 formed in the array region B is used to protect the underlying structure during subsequent processing operations.

Figure 15:
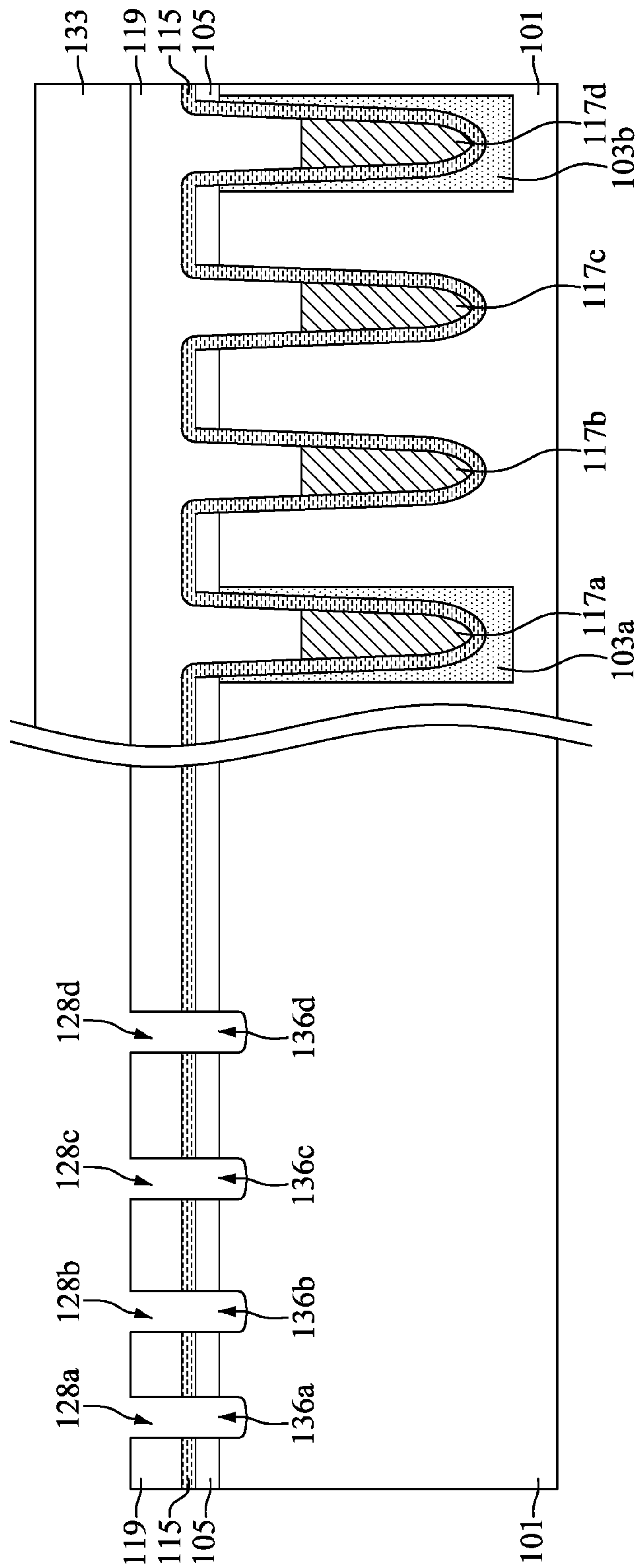
FIG. 15 is a cross-sectional view illustrating an intermediate stage of etching the semiconductor substrate to form recesses in a peripheral circuit region during the formation of the memory device, in accordance with some embodiments.

Next, the semiconductor substrate 101 is etched to form recesses 136*a*, 136*b*, 136*c* and 136*d* in the peripheral circuit region A, as shown in FIG. 15 in accordance with some embodiments. The respective step is illustrated as the step S11 in the method 10 shown in FIG. 3. In some embodiments, the semiconductor substrate 101 is etched through the openings 128*a*, 128*b*, 128*c* and 128*d*. In some embodiments, the recesses 136*a*, 136*b*, 136*c* and 136*d* in the peripheral circuit region A are formed by a wet etching process, a dry etching process, or a combination thereof.

Figure 16:
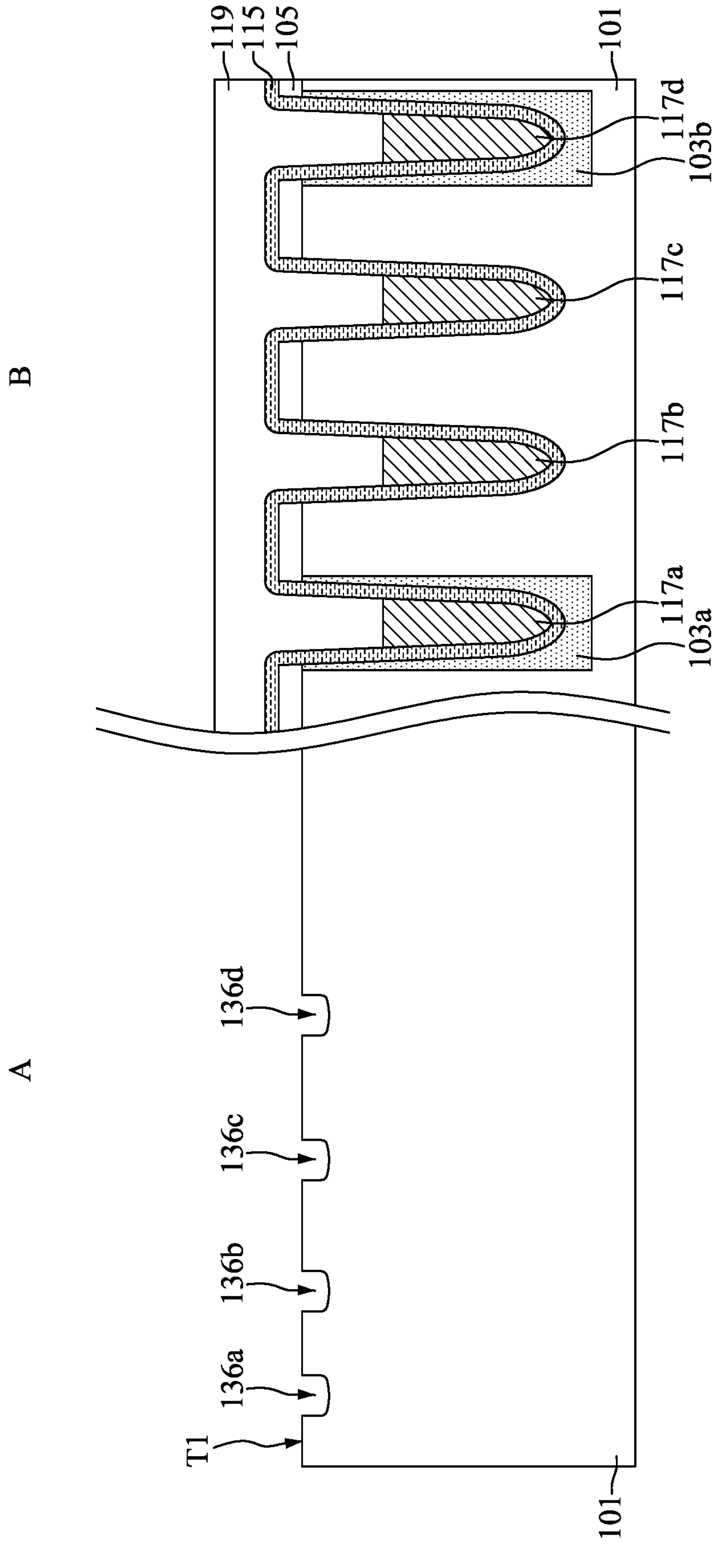
FIG. 16 is a cross-sectional view illustrating an intermediate stage of removing the layers over the semiconductor substrate in the peripheral circuit region during the formation of the memory device, in accordance with some embodiments.

Subsequently, the dielectric cap layer 119, the gate dielectric layer 115 and the mask layer 105 in the peripheral circuit region A are removed, as shown in FIG. 16 in accordance with some embodiments. In some embodiments, the dielectric cap layer 119, the gate dielectric layer 115 and the mask layer 105 in the peripheral circuit region A are removed by a stripping process, an ashing process, an etching process, or another suitable process. In some embodiments, the structure of the array region B is protected by the patterned photo resist 133 (see FIG. 15) during the process for removing the dielectric cap layer 119, the gate dielectric layer 115 and the mask layer 105 in the peripheral circuit region A. After the top surface T1 of the semiconductor substrate 101 is exposed in the peripheral circuit region A, the patterned photo resist 133 in the array region B is removed, in accordance with some embodiments.

Figure 17:
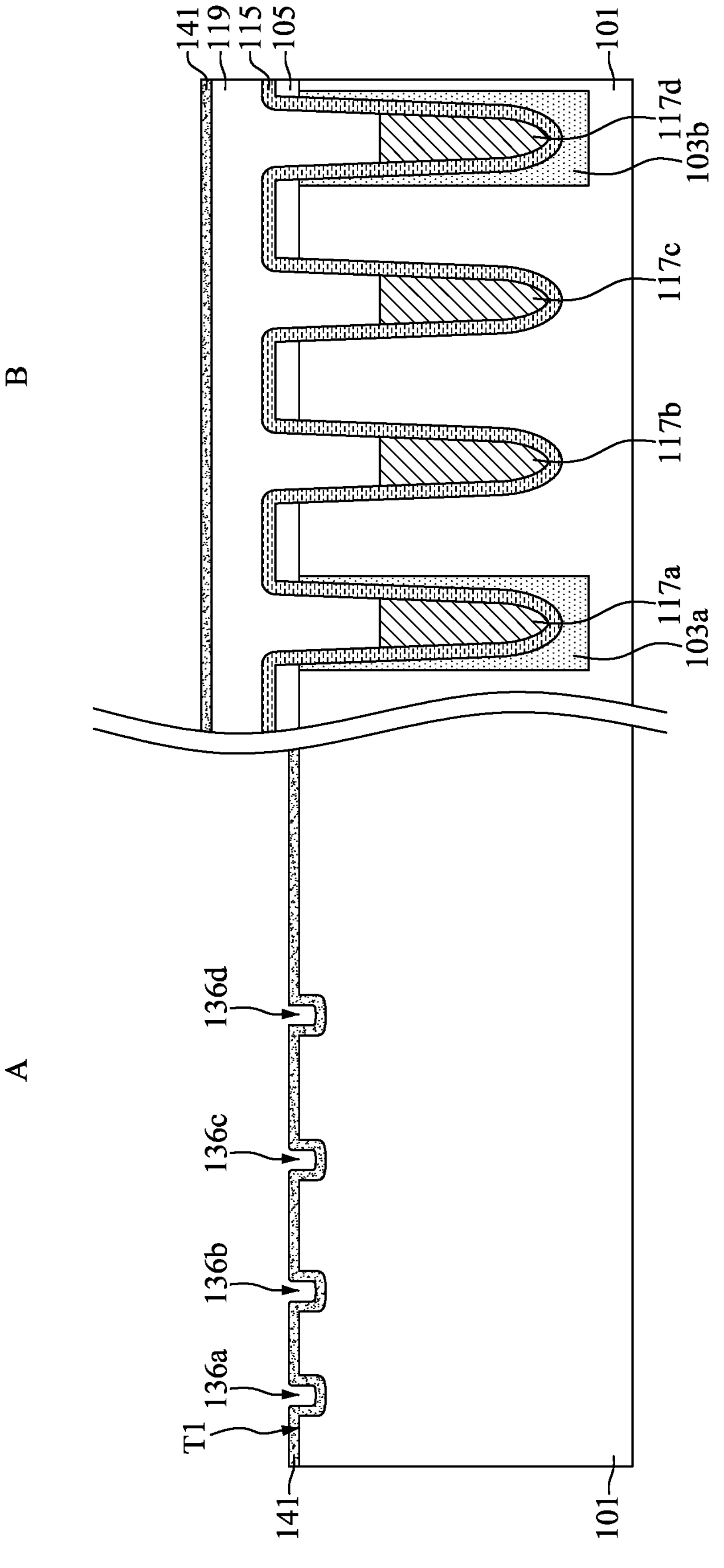
FIG. 17 is a cross-sectional view illustrating an intermediate stage of forming a high-k gate dielectric material lining the recesses and covering the top surface of the semiconductor substrate during the formation of the memory device, in accordance with some embodiments.

Then, a high-k gate dielectric material 141 is formed lining the recesses 136*a*, 136*b*, 136*c*, 136*d* and covering the top surface T1 of the semiconductor substrate 101, as shown in FIG. 17 in accordance with some embodiments. The respective step is illustrated as the step S13 in the method 10 shown in FIG. 3. In some embodiments, the high-k gate dielectric material 141 extends to cover the dielectric cap layer 119 in the array region B.

In some embodiments, the high-k gate dielectric material 141 includes HfSiON, HfON, another suitable dielectric material having a dielectric constant (k) higher than that of silicon dioxide, or a combination thereof. In some embodiments, the high-k gate dielectric material 141 is formed by a deposition process, such as a CVD process, a PVD process, an ALD process, a spin-on coating process, or another suitable deposition process.

Figure 18:
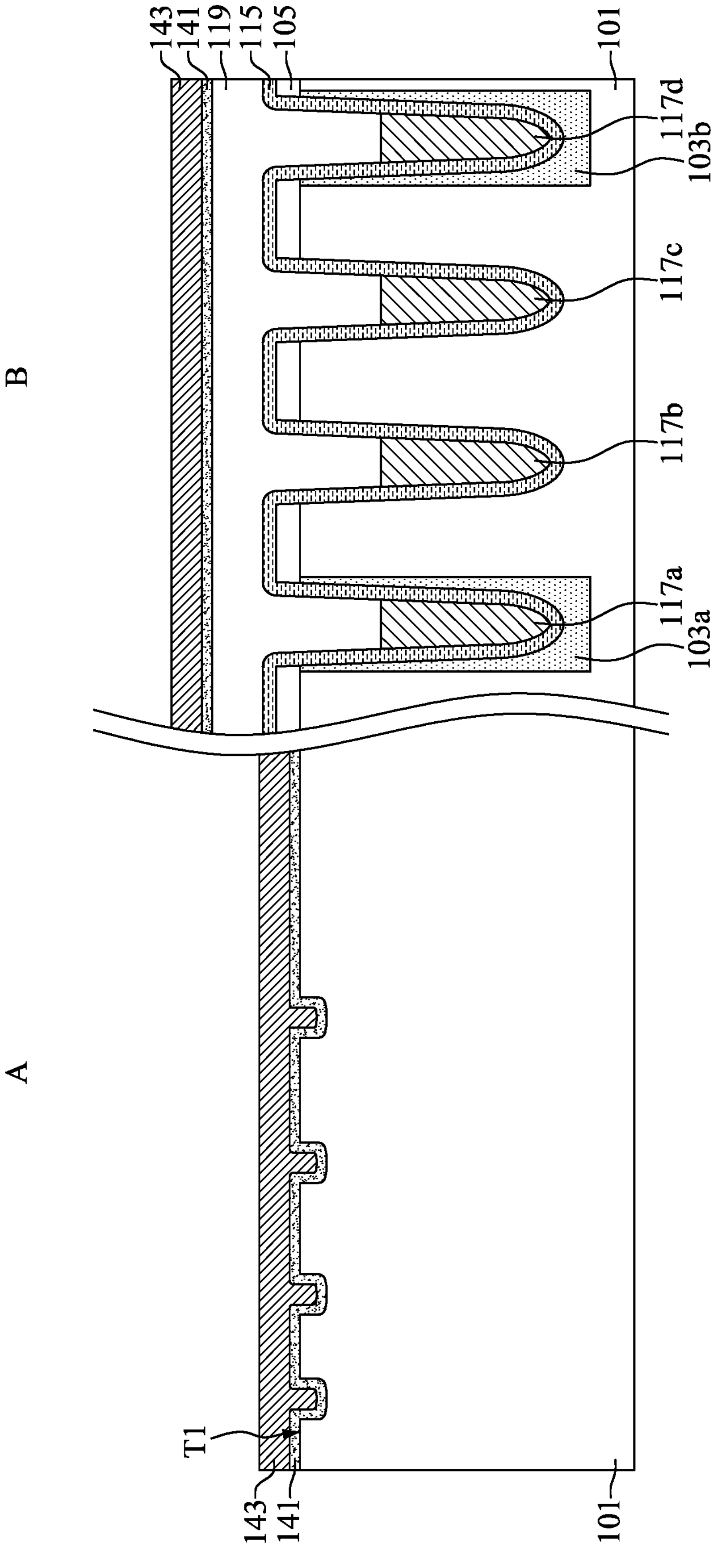
FIG. 18 is a cross-sectional view illustrating an intermediate stage of forming a metal gate electrode material in the recesses and over the top surface of the semiconductor substrate during the formation of the memory device, in accordance with some embodiments.

Next, a metal gate electrode material 143 is formed to cover the high-k gate dielectric material 141, as shown in FIG. 18 in accordance with some embodiments. The respective step is illustrated as the step S15 in the method 10 shown in FIG. 3. In some embodiments, the remaining portions of the recesses 136*a*, 136*b*, 136*c*, 136*d* over the high-k gate dielectric material 141 (FIG. 17) are filled by the metal gate electrode material 143. In some embodiments, the metal gate electrode material 143 extends over the top surface T1 of the semiconductor substrate. In some embodiments, the metal gate electrode material 143 extends to cover the high-k gate dielectric material 141 in the array region B.

In some embodiments, the metal gate electrode material 143 includes TiN, W, Ru, Al, a RuAl alloy, another suitable metal, or a combination thereof. In some embodiments, the metal gate electrode material 143 is formed by a deposition process, such as a CVD process, a PVD process, a sputtering process, a plating process, or another suitable deposition process.

Figure 19:
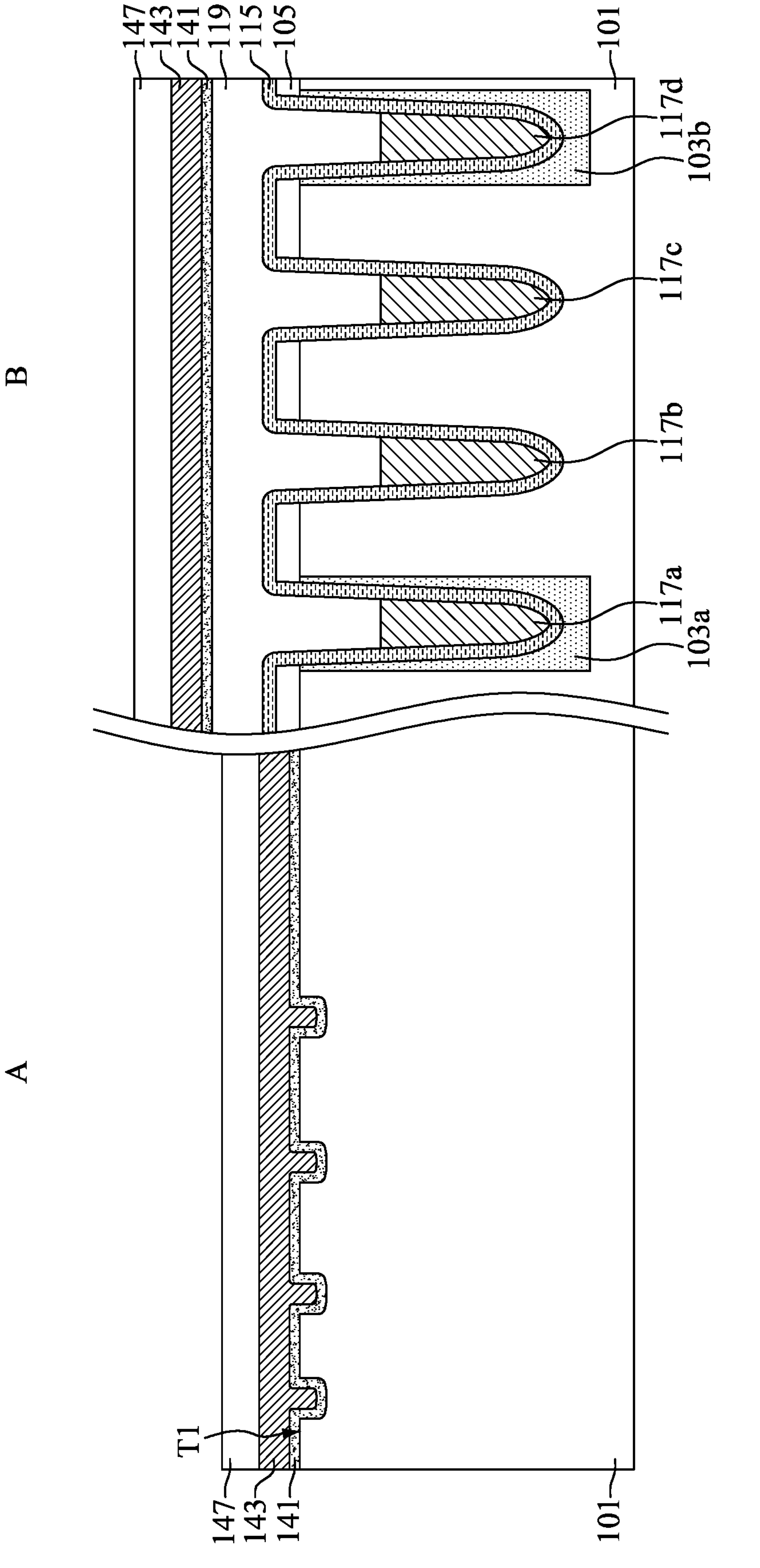
FIG. 19 is a cross-sectional view illustrating an intermediate stage of forming a dielectric layer over the metal gate electrode material during the formation of the memory device, in accordance with some embodiments.

Subsequently, a dielectric layer 147 is formed to cover the metal gate electrode material 143, as shown in FIG. 19 in accordance with some embodiments. The respective step is illustrated as the step S17 in the method 10 shown in FIG. 3. In some embodiments, the dielectric layer 147 extends to cover the metal gate electrode material 143 in the array region B. In some embodiments, the dielectric layer 147 includes silicon nitride. However, any other suitable dielectric materials may be utilized, such as silicon oxide, silicon oxynitride, or another suitable dielectric material. In some embodiments, the dielectric layer 147 is formed by a CVD process, a PVD process, a spin-on coating process, another suitable process, or a combination thereof.

Figure 20:
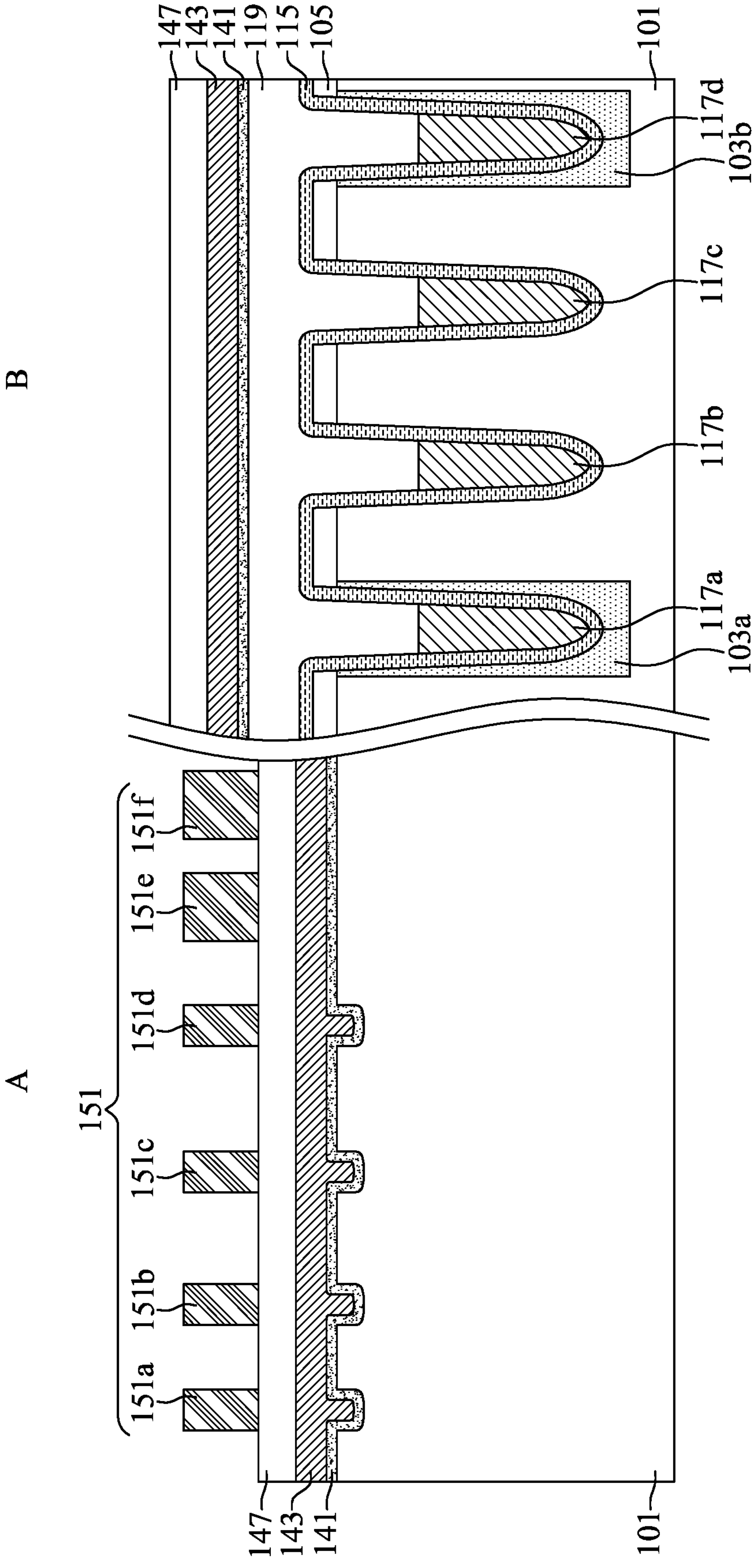
FIG. 20 is a cross-sectional view illustrating an intermediate stage of forming a patterned photo resist over the dielectric layer in the peripheral circuit region during the formation of the memory device, in accordance with some embodiments.

Then, a patterned photo resist 151 is formed over the dielectric layer 147 in the peripheral circuit region A, as shown in FIG. 20 in accordance with some embodiments. The respective step is illustrated as the step S19 in the method 10 shown in FIG. 3. In some embodiments, the patterned photo resist 151 includes portions 151*a*, 151*b*, 151*c*, 151*d*, 151*e* and 151*f*, and the portions 151*a* to 151*f* are separated from each other.

Figure 21:
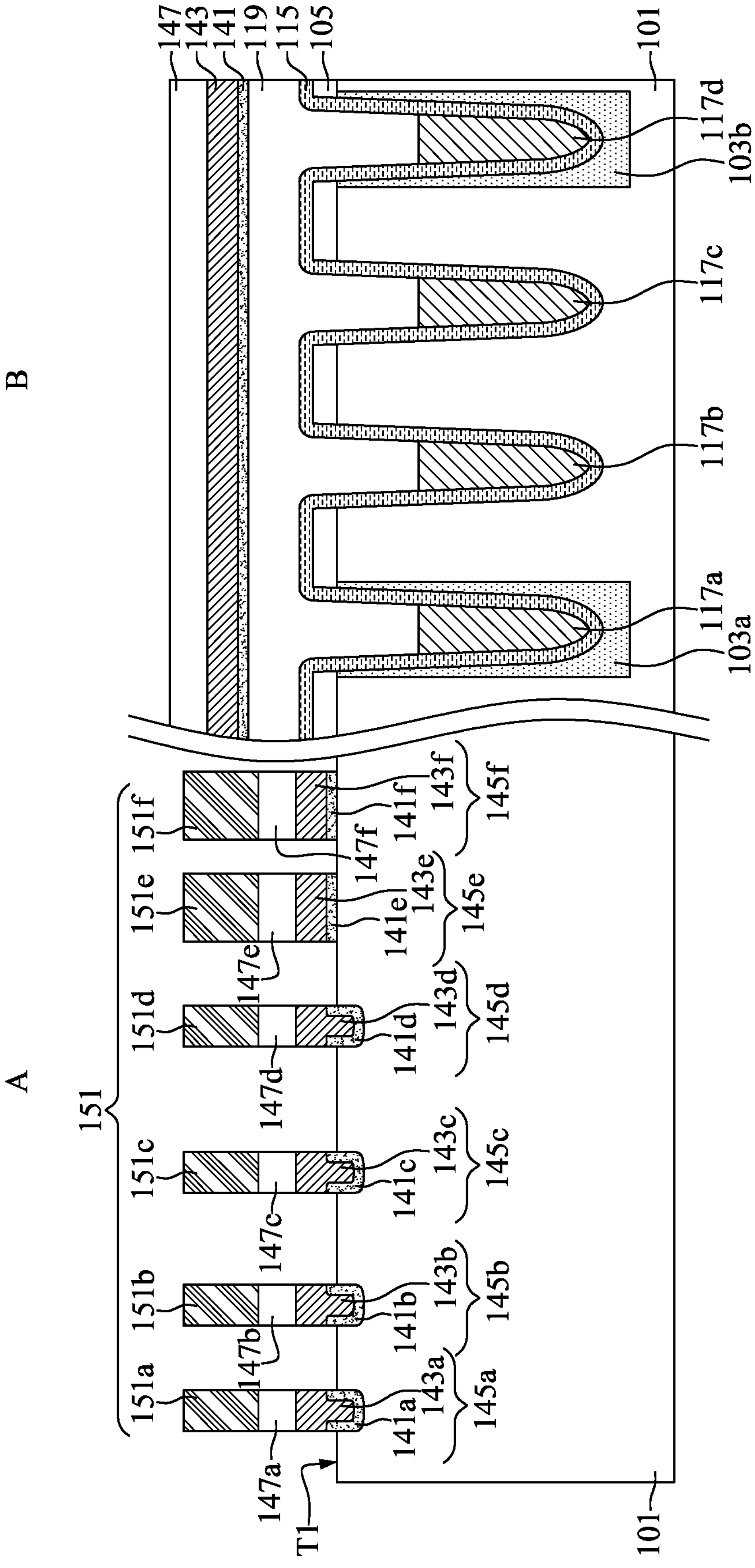
FIG. 21 is a cross-sectional view illustrating an intermediate stage of etching the underlying materials using the patterned photo resist as a mask such that recessed gate structures and planar gate structures are formed in the peripheral circuit region during the formation of the memory device, in accordance with some embodiments.

Next, an etching process is performed using the patterned photo resist 151 as a mask to form recessed gate structures 145*a*, 145*b*, 145*c*, 145*d* and planar gate structures 145*e*, 145*f* in the peripheral circuit region A, as shown in FIG. 21 in accordance with some embodiments. In some embodiments, the dielectric layer 147, the metal gate electrode material 143 and the high-k gate dielectric material 141 are etched to expose the top surface T1 of the semiconductor substrate 101 in the peripheral circuit region A. The respective step is illustrated as the step S21 in the method 10 shown in FIG. 3.

In some embodiments, the remaining portions of the high-k gate dielectric material 141 and the remaining portions of the metal gate electrode material 143 form the recessed gate structures 145*a*, 145*b*, 145*c*, 145*d* and the planar gate structures 145*e* and 145*f*. In some embodiments, the recessed gate structure 145*a* includes a high-k gate dielectric layer 141*a* and a metal gate electrode layer 143*a*, the recessed gate structure 145*b* includes a high-k gate dielectric layer 141*b* and a metal gate electrode layer 143*b*, the recessed gate structure 145*c* includes a high-k gate dielectric layer 141*c* and a metal gate electrode layer 143*c*, and the recessed gate structure 145*d* includes a high-k gate dielectric layer 141*d* and a metal gate electrode layer 143*d*. Moreover, in some embodiments, the planar gate structure 145*e* includes a high-k gate dielectric layer 141*e* and a metal gate electrode layer 143*e*, the planar gate structure 145*f* includes a high-k gate dielectric layer 141*f* and a metal gate electrode layer 143*f*.

In addition, the remaining portions of the dielectric layer 147 form dielectric portions 147*a*, 147*b*, 147*c*, 147*d*, 147*e* and 147*f*, in accordance with some embodiments. In some embodiments, the dielectric portions 147*a*, 147*b*, 147*c* and 147*d* are disposed over the recessed gate structures 145*a*, 145*b*, 145*c* and 145*d*, respectively. In some embodiments, the dielectric portions 147*e* and 147*f* are disposed over the planar gate structures 145*e* and 145*f*, respectively.

Subsequently, referring back to FIG. 1, the portions 151*a*, 151*b*, 151*c*, 151*d*, 151*e* and 151*f* of the patterned photo resist 151 (see FIG. 21) in the peripheral circuit region A are removed, and the high-k gate dielectric material 141, the metal gate electrode material 143 and the dielectric layer 147 in the array region B are removed, in accordance with some embodiments. In some embodiments, the patterned photo resist 151 in the peripheral circuit region A is removed by a stripping process, an ashing process, an etching process, or another suitable process. Some processes used to remove the high-k gate dielectric material 141, the metal gate electrode material 143 and the dielectric layer 147 in the array region B are similar to, or the same as those used to remove the patterned photo resist 151, and details thereof are not repeated herein.

Figure 22:
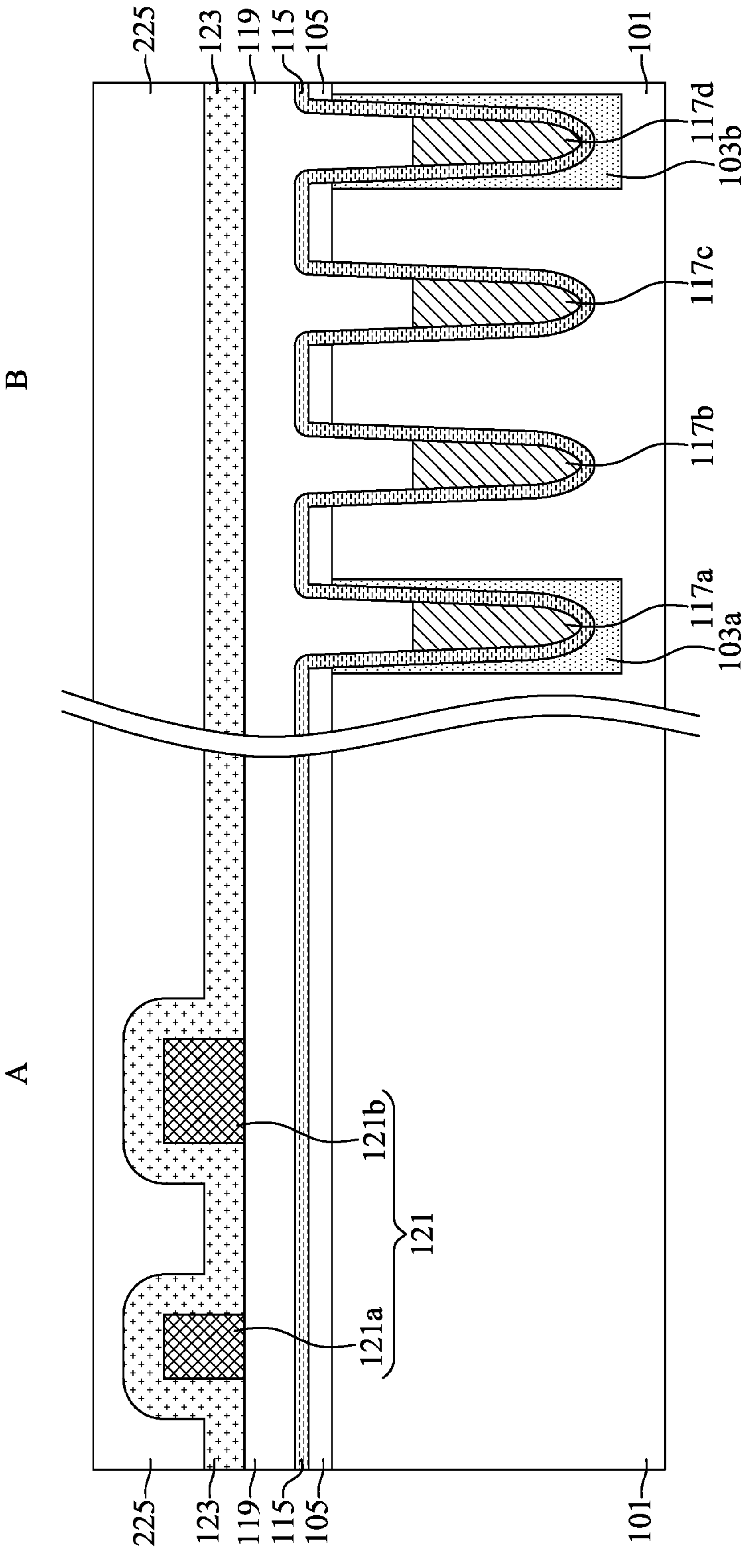
FIG. 22 is a cross-sectional view illustrating an intermediate stage of forming an underlayer covering the dielectric layer over the patterned photo resist during the formation of the memory device, in accordance with some embodiments.

FIGS. 22 to 25 are cross-sectional views illustrating intermediate stages in the formation of the memory device 100, in accordance with some other embodiments. It should be pointed out that operations before the structure shown in FIG. 22 are substantially the same as the operations shown in FIGS. 4 to 9, and the related detailed descriptions may refer to the foregoing paragraphs and are not discussed again herein.

After the dielectric layer 123 is formed, an underlayer 225 is formed over the dielectric layer 123, as shown in FIG. 22 in accordance with some embodiments. In some embodiments, the underlayer 225 is formed to cover the structures in the peripheral circuit region A and the array region B. Some materials and processes used to form the underlayer 225 are similar to, or the same as those used to form the underlayer 125 (see FIG. 11), and details thereof are not repeated herein.

Figure 23:
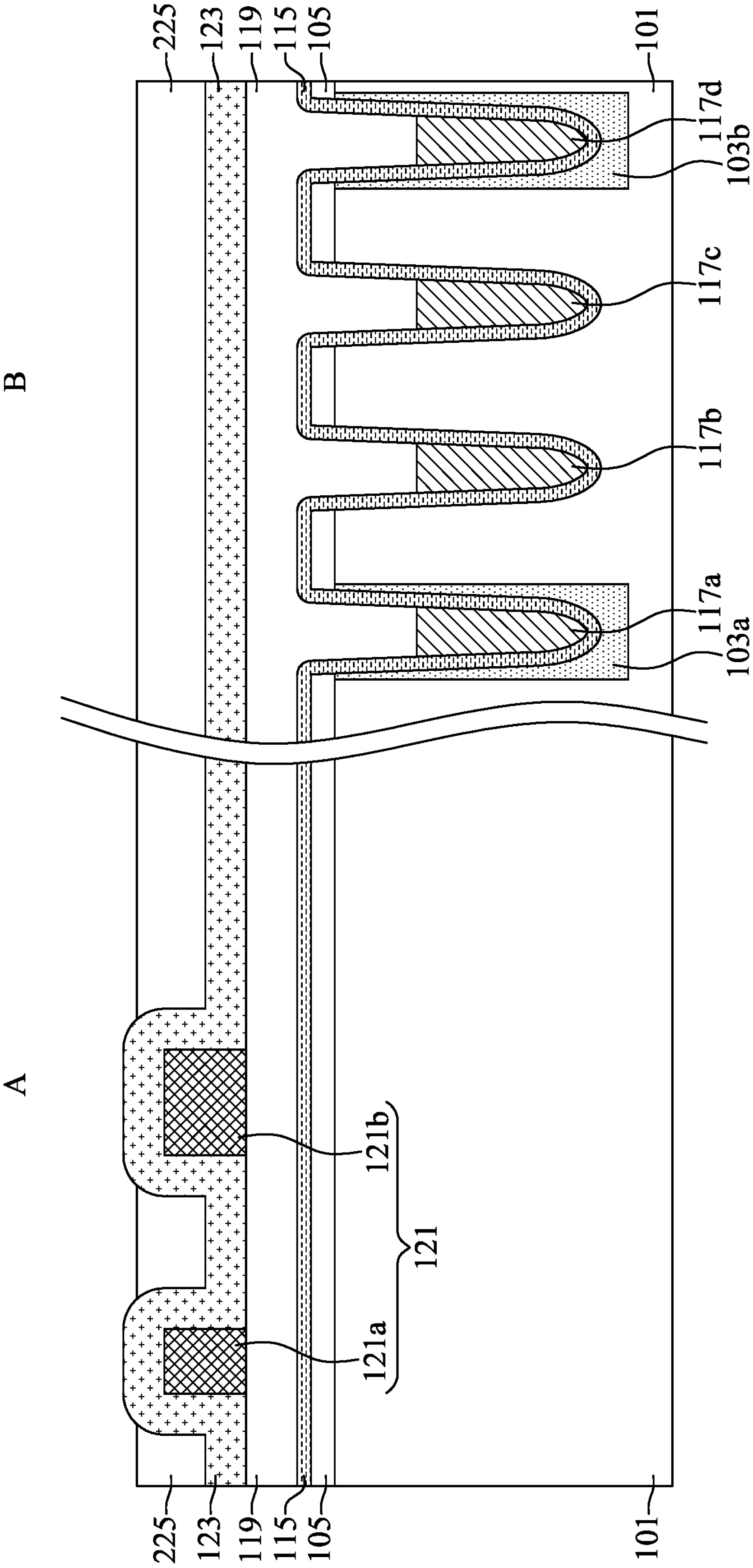
FIG. 23 is a cross-sectional view illustrating an intermediate stage of etching the underlayer to expose the dielectric layer over the patterned photo resist during the formation of the memory device, in accordance with some embodiments.

Next, the underlayer 225 is partially removed by an etch back process to expose the dielectric layer 123, as shown in FIG. 23 in accordance with some embodiments. In some embodiments, the etch back process includes a wet etching process, a dry etching process, or a combination thereof. In some embodiments, the underlayer 225 is etched until the dielectric layer 123 is exposed.

Figure 24:
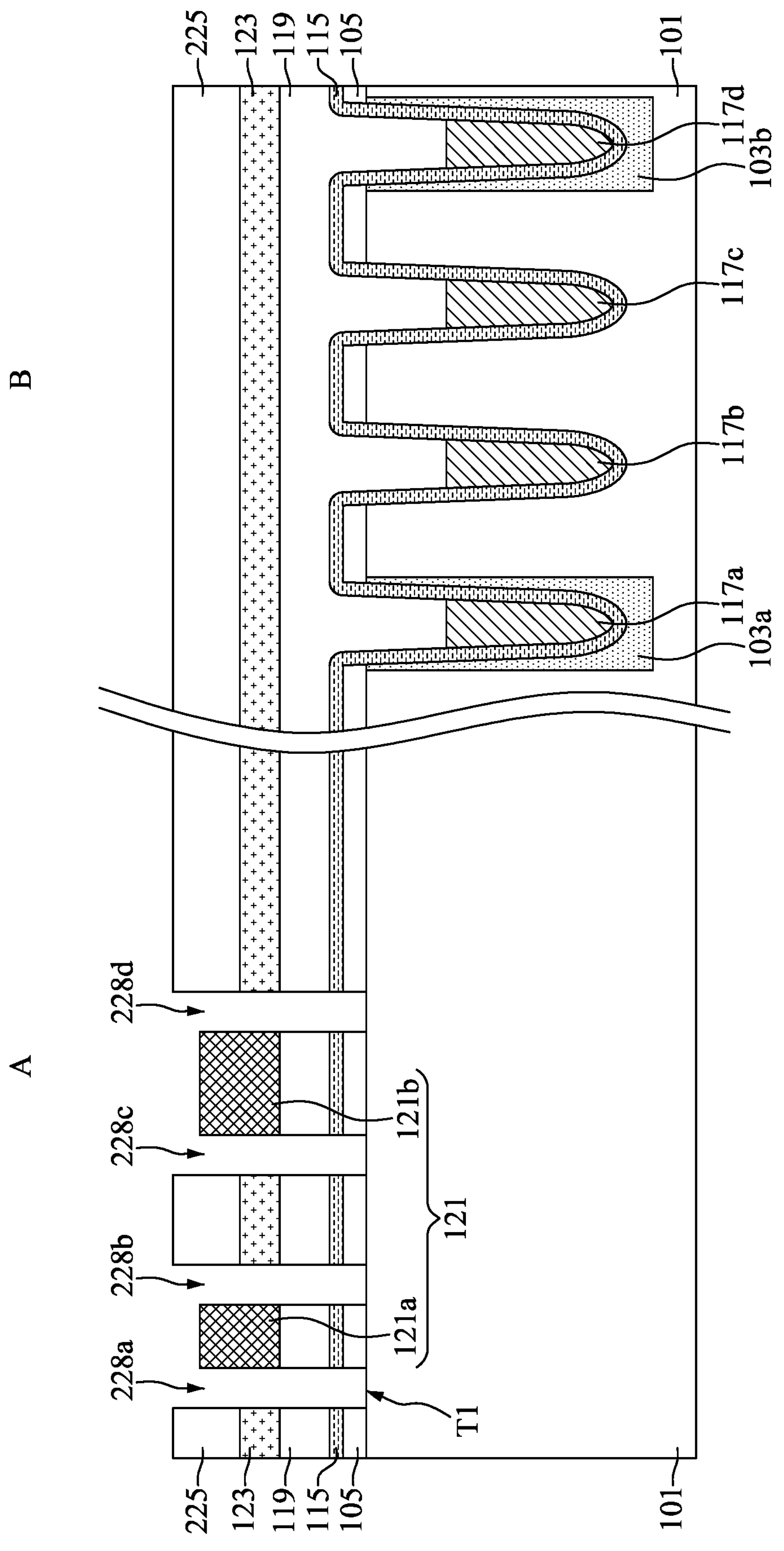
FIG. 24 is a cross-sectional view illustrating an intermediate stage of etching the dielectric layer and the underlying layers to expose the semiconductor substrate during the formation of the memory device, in accordance with some embodiments.

Subsequently, an etching process is performed to form openings 228*a*, 228*b*, 228*c* and 228*d* in the peripheral circuit region A, as shown in FIG. 24 in accordance with some embodiments. In some embodiments, the etching process includes an ion bombardment process. In some embodiments, the dielectric layer 123, the dielectric cap layer 119, the gate dielectric layer 115 and the mask layer 105 are partially removed by the etching process. In some embodiments, the top surface T1 of the semiconductor substrate 101 is partially exposed by the openings 228*a*, 228*b*, 228*c* and 228*d* in the peripheral circuit region A.

Figure 25:
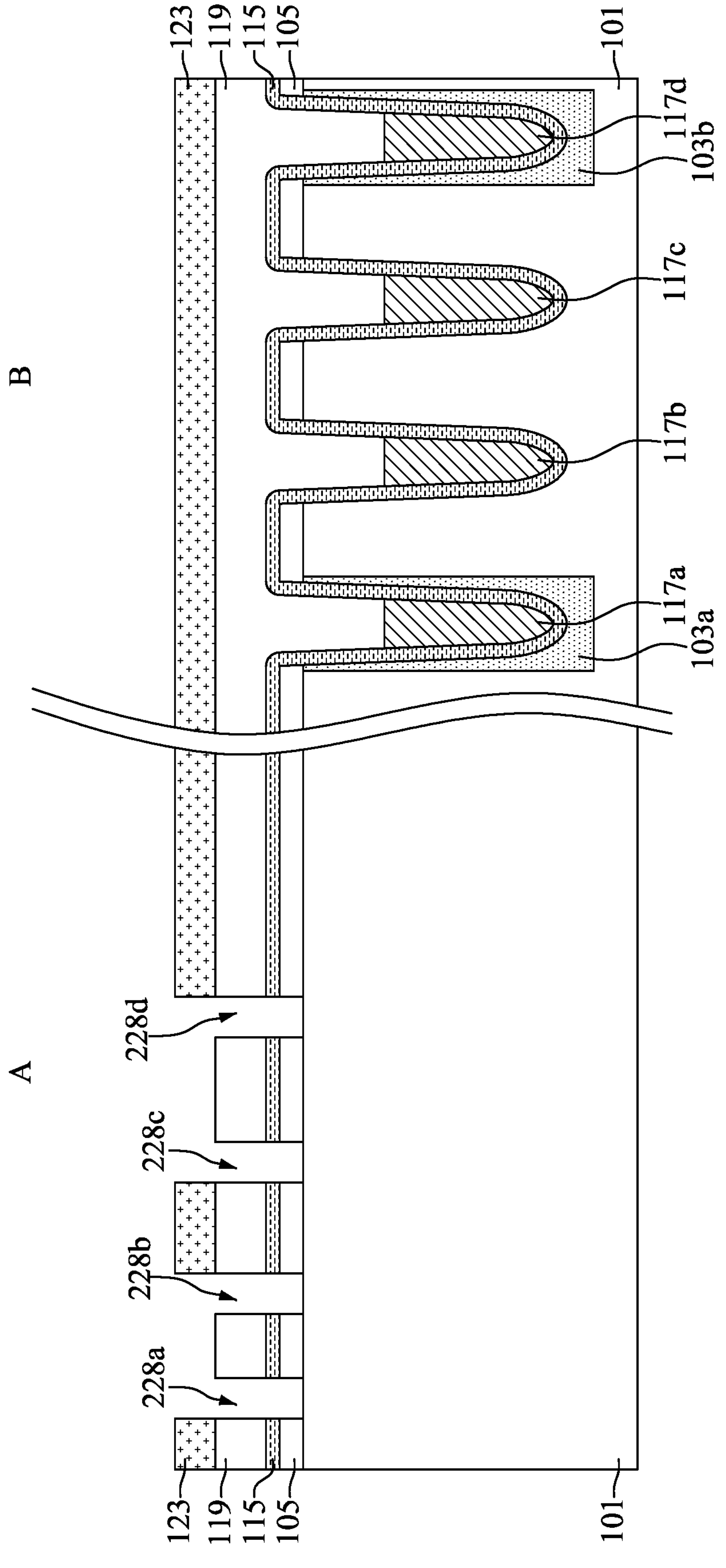
FIG. 25 is a cross-sectional view illustrating an intermediate stage of removing the underlayer and the patterned photo resist during the formation of the memory device, in accordance with some embodiments.

Then, the portions 121*a*, 121*b* of the patterned photo resist 121 and the underlayer 225 are removed (see FIG. 24), as shown in FIG. 25 in accordance with some embodiments. In some embodiments, the patterned photo resist 121 and the underlayer 225 are removed by a stripping process, an ashing process, an etching process, or another suitable process.

After the patterned photo resist 121 and the underlayer 225 are removed, the remaining portions of the dielectric layer 123 is removed by a stripping process, an ashing process, an etching process, or another suitable process, and then, a patterned photo resist 133 is formed to cover the array region B, as shown in FIG. 14 in accordance with some embodiments. In some embodiments, the patterned photo resist 133 formed in the array region B is used to protect the underlying structure during subsequent processing operations. After the patterned photo resist 133 is formed, the process steps are similar to, or the same as the steps shown in FIGS. 15 to 21, which resulting in the memory device 100 shown in FIG. 1, details thereof are not repeated herein.

Figure 26:
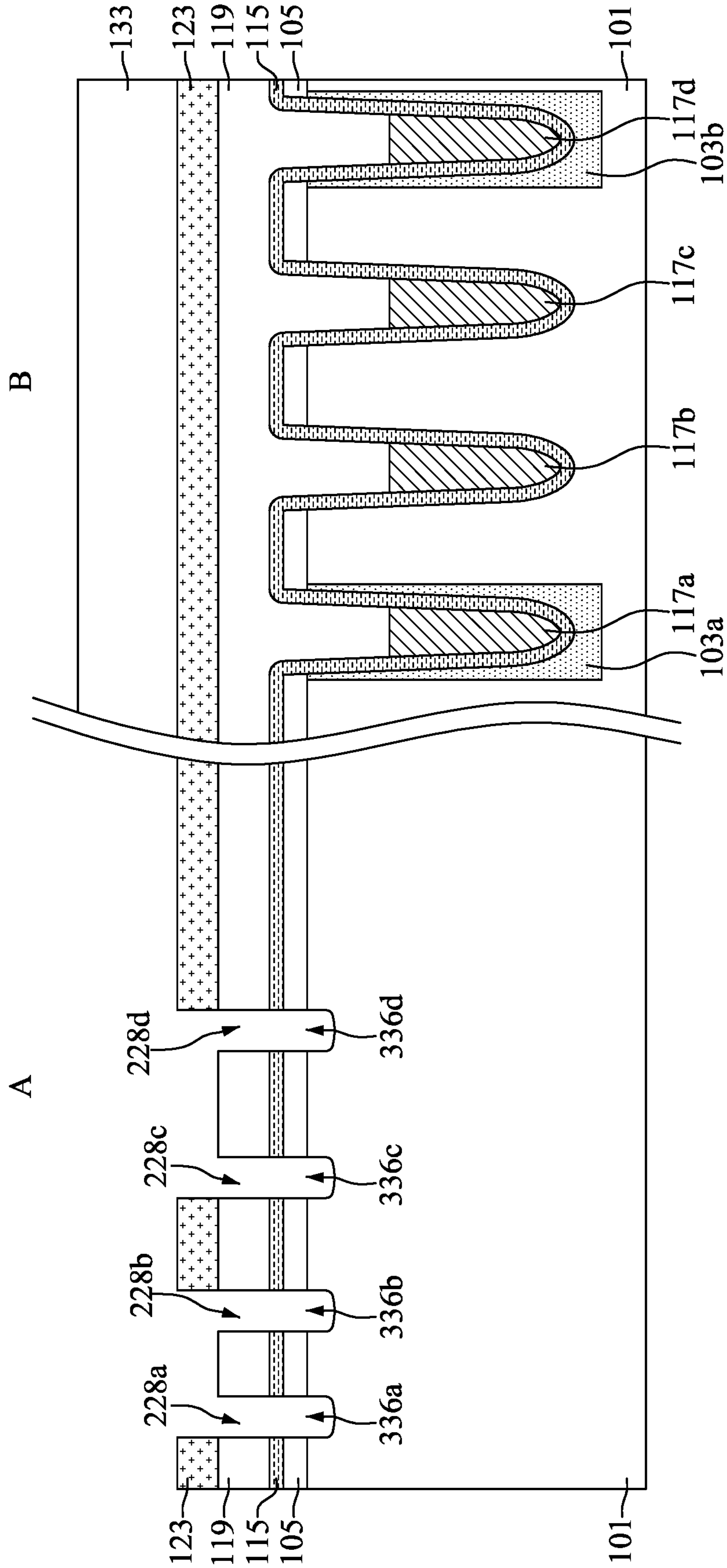
FIG. 26 is a cross-sectional view illustrating an intermediate stage of etching the semiconductor substrate to form recesses in the peripheral circuit region during the formation of the memory device, in accordance with some embodiments.

Referring back to FIG. 25, after the patterned photo resist 121 and the underlayer 225 are removed, a patterned photo resist 133 is formed to cover the array region B, and then, the semiconductor substrate 101 is etched to form recesses 336*a*, 336*b*, 336*c* and 336*d* in the peripheral circuit region A, as shown in FIG. 26 in accordance with some other embodiments. In some embodiments, the semiconductor substrate 101 is etched through the openings 228*a*, 228*b*, 228*c* and 228*d*. Some processes used to form the recesses 336*a*, 336*b*, 336*c* and 336*d* are similar to, or the same as those used to form the recesses 136*a*, 136*b*, 136*c* and 136*d* (see FIG. 15), and details thereof are not repeated herein.

After the recesses 336*a*, 336*b*, 336*c* and 336*d* are formed in the peripheral circuit region A, the remaining portions of the dielectric layer 123, the dielectric cap layer 119, the gate dielectric layer 115 and the mask layer 105 in the peripheral circuit region A are removed by a stripping process, an ashing process, an etching process, or another suitable process. In some embodiments, the structure of the array region B is protected by the patterned photo resist 133 during the process for removing the layers over the semiconductor substrate 101 in the peripheral circuit region A. Then, the patterned photo resist 133 in the array region B is removed, and the following process steps are similar to, or the same as the steps shown in FIGS. 16 to 21, which resulting in the memory device 100 shown in FIG. 1, details thereof are not repeated herein.

Figure 27:
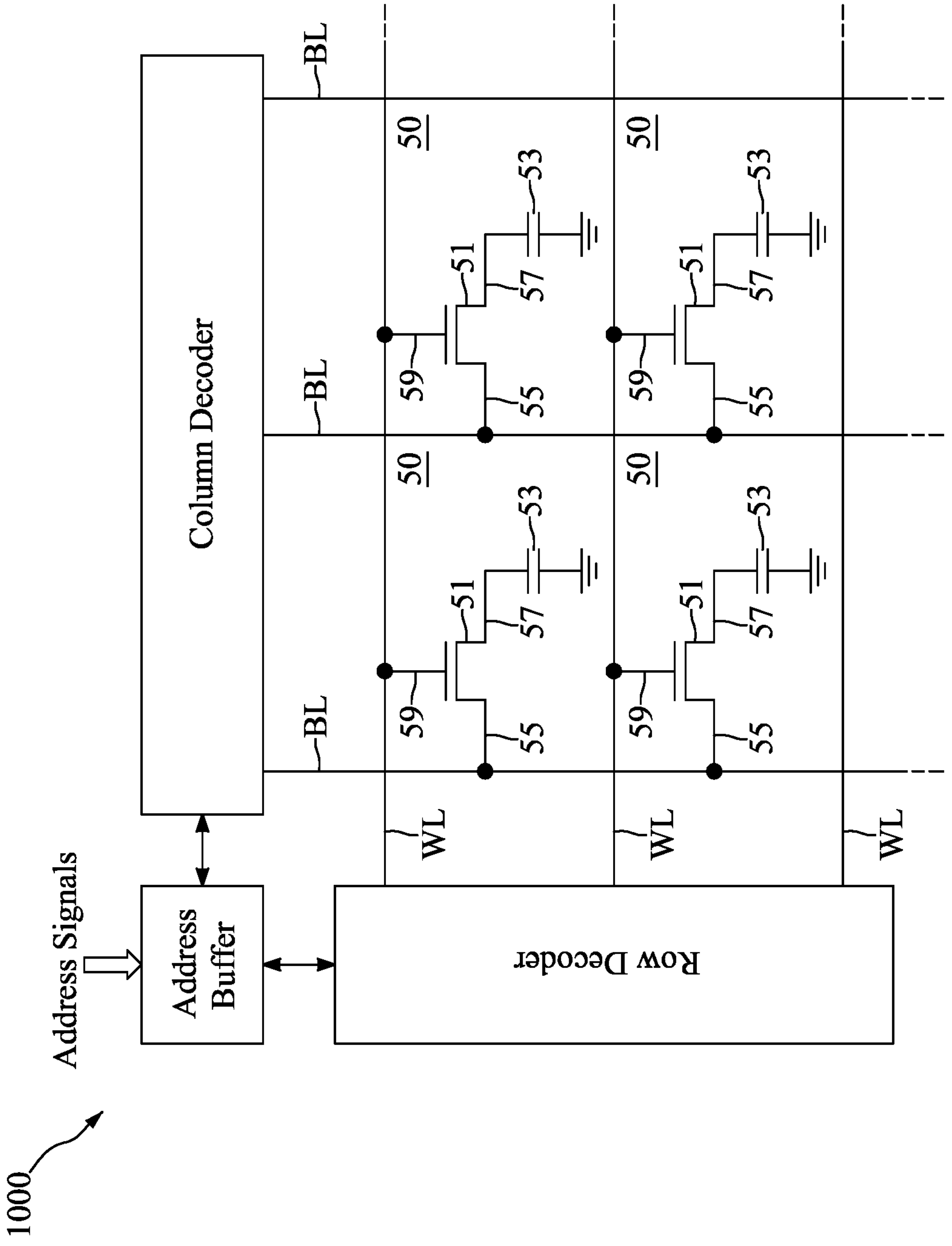
FIG. 27 is a partial schematic illustration of an exemplary integrated circuit, including an array of memory cells in accordance with some embodiments.

FIG. 27 is a partial schematic illustration of an exemplary integrated circuit, such as a memory device 1000, including an array of memory cells 50 in accordance with some embodiments. In some embodiments, the memory device 1000 includes a DRAM. In some embodiments, the memory device 1000 includes a number of memory cells 50 arranged in a grid pattern and including a number of rows and columns. The number of memory cells 50 may vary depending on system requirements and fabrication technology.

In some embodiments, each of the memory cells 50 includes an access device and a storage device. The access device is configured to provide controlled access to the storage device. In particular, the access device is a field effect transistor (FET) 51 and the storage device is a capacitor 53, in accordance with some embodiments. In each of the memory cells 50, the FET 51 includes a drain 55, a source 57 and a gate 59. One terminal of the capacitor 53 is electrically connected to the source 57 of the FET 51, and the other terminal of the capacitor 53 may be electrically connected to the ground. In addition, in each of the memory cells 50, the gate 59 of the FET 51 is electrically connected to a word line WL, and the drain 55 of the FET 51 is electrically connected to a bit line BL.

The above description mentions the terminal of the FET 51 electrically connected to the capacitor 53 is the source 57, and the terminal of the FET 51 electrically connected to the bit line BL is the drain 55. However, during read and write operations, the terminal of the FET 51 electrically connected to the capacitor 53 may be the drain, and the terminal of the FET 51 electrically connected to the bit line BL may be the source. That is, either terminal of the FET 51 could be a source or a drain depending on the manner in which the FET 51 is being controlled by the voltages applied to the source, the drain and the gate.

By controlling the voltage at the gate 59 via the word line WL, a voltage potential may be created across the FET 30 such that the electrical charge can flow from the drain 55 to the capacitor 53. Therefore, the electrical charge stored in the capacitor 53 may be interpreted as a binary data value in the memory cell 30. For example, a positive charge above a threshold voltage stored in the capacitor 53 may be interpreted as binary "1." If the charge in the capacitor 53 is below the threshold value, a binary value of "0" is said to be stored in the memory cell 30.

The bit lines BL are configured to read and write data to and from the memory cells 50. The word lines WL are configured to activate the FET 51 to access a particular row of the memory cells 50. Accordingly, the memory device 1000 also includes a periphery circuit region which may include an address buffer, a row decoder and a column decoder. The row decoder and the column decoder selectively access the memory cells 50 in response to address signals that are provided to the address buffer during read, write and refresh operations. The address signals are typically provided by an external controller such as a microprocessor or another type of memory controller.

Referring back to FIGS. 1 and 2, the peripheral circuit region A may be any of the regions in the address buffer, row decoder, or column decoder, and the array region B may be any of the regions of the memory cells 50 in the memory device 1000.

Embodiments of the memory device 100 and method for preparing the same are provided in the disclosure. In some embodiments, the memory device 100 includes the recessed gate structures 145*a*, 145*b*, 145*c* and 145*d*, and the planar gate structures 145*e* and 145*f* in the peripheral circuit region A. In some embodiments, the recessed gate structures 145*a*, 145*b*, 145*c* and 145*d* includes the high-k gate dielectric layers 141*a*, 141*b*, 141*c* and 141*d* disposed in the semiconductor substrate 101, and the metal gate electrode layers 143*a*, 143*b*, 143*c* and 143*d* disposed over the high-k gate dielectric layers 141*a*, 141*b*, 141*c* and 141*d*, respectively. Therefore, gate-to-substrate leakage current can be reduced. In addition, the planar gate structures 145*e*, 145*f* and the recessed gate structures 145*a*, 145*b*, 145*c*, 145*d* are formed simultaneously in the peripheral circuit region A, the drive current of the memory device 100 may be increased. As a result, the performance of the memory device may be improved.

In one embodiment of the present disclosure, a memory device is provided. The memory device includes a first high-k gate dielectric layer disposed in a semiconductor substrate. A top surface of the first high-k gate dielectric layer is higher than a top surface of the semiconductor substrate. The memory device also includes a first metal gate electrode layer disposed over the first high-k gate dielectric layer. A lower portion of the first metal gate electrode layer is surrounded by the first high-k gate dielectric layer, and a width of an upper portion of the first metal gate electrode layer is greater than a width of the lower portion of the first metal gate electrode layer. The memory device further includes a first dielectric portion disposed over the first metal gate electrode layer.

In another embodiment of the present disclosure, a memory device is provided. The memory device includes a recessed gate structure disposed in a semiconductor substrate. The recessed gate structure includes a first high-k gate dielectric layer and a first metal gate electrode layer. A top surface of the first high-k gate dielectric layer is higher than a top surface of the semiconductor substrate, and the first metal gate electrode layer extends over the top surface of the first high-k gate dielectric layer. The memory device also includes a planar gate structure disposed over the semiconductor substrate and separated from the recessed gate structure. The planar gate structure includes a second high-k gate dielectric layer and a second metal gate electrode layer disposed over the second high-k gate dielectric layer.

In yet another embodiment of the present disclosure, a method for preparing a memory device is provided. The method includes forming a recess in a semiconductor substrate, and forming a high-k gate dielectric material covering a top surface of the semiconductor substrate and lining the recess. The method also includes forming a metal gate electrode material covering the high-k gate dielectric material, and forming a first dielectric layer covering the metal gate electrode material. The method further includes forming a first patterned photo resist over the first dielectric layer, and etching the high-k gate dielectric material, the metal gate electrode material and the first dielectric layer using the first patterned photo resist as a mask to form a recessed gate structure and a first dielectric portion over the recessed gate structure. The recessed gate structure includes a first high-k gate dielectric layer and a first metal gate electrode layer over the first high-k gate dielectric layer, and a top surface of the first high-k gate dielectric layer is higher than the top surface of the semiconductor substrate.

The embodiments of the present disclosure have some advantageous features. By forming recessed gate structures with high-k gate dielectric layers and metal gate electrode layers in the peripheral circuit region, gate-to-substrate leakage current can be reduced. In addition, since planar gate structures and recessed gate structures are formed simultaneously in the peripheral circuit region, the drive current of the memory device 100 may be increased. As a result, the performance of the memory device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A memory device, comprising:

a recessed gate structure disposed in a semiconductor substrate, wherein the recessed gate structure comprises:

a first high-k gate dielectric layer, wherein a top surface of the first high-k gate dielectric layer is higher than a top surface of the semiconductor substrate; and a first metal gate electrode layer surrounded by the first high-k gate dielectric layer, wherein the first metal gate electrode layer extends over the top surface of the first high-k gate dielectric layer; and a planar gate structure disposed over the semiconductor substrate and separated from the recessed gate structure, wherein the planar gate structure comprises:

a second high-k gate dielectric layer; and a second metal gate electrode layer disposed over the second high-k gate dielectric layer;

wherein a top surface of the second high-k gate dielectric layer is coplanar with the top surface of the first high-k gate dielectric layer;

wherein a bottom surface of the second high-k gate dielectric layer is below a bottom surface of the first high-k gate dielectric layer.

2. The memory device of claim 1, wherein the recessed gate structure and the planar gate structure are disposed in a peripheral circuit region of the memory device and are spaced apart from each other.

3. The memory device of claim 1, wherein the first metal gate electrode layer is in direct contact with the top surface of the first high-k gate dielectric layer.

4. The memory device of claim 1, wherein a material of the first high-k gate dielectric layer is the same as a material of the second high-k gate dielectric layer, wherein the bottom surface of the first high-k gate dielectric layer is below the top surface of the semiconductor substate, wherein the bottom surface of the second high-k gate dielectric layer is in contact with the top surface of the semiconductor substate.

5. The memory device of claim 4, wherein a material of the first metal gate electrode layer is the same as a material of the second metal gate electrode layer, wherein a top surface of the second metal gate electrode layer is coplanar with a top surface of the first metal gate electrode layer.

6. The memory device of claim 1, wherein the first metal gate electrode layer has a lower portion surrounded by the first high-k gate dielectric layer and an upper portion above the top surface of the first high-k gate dielectric layer, and wherein a width of the upper portion of the first metal gate electrode layer is greater than a width of the lower portion of the first metal gate electrode layer.

7. The memory device of claim 6, wherein the width of the upper portion of the first metal gate electrode layer is substantially the same as a width of the first high-k gate dielectric layer.

8. The memory device of claim 6, wherein a sidewall of the first high-k gate dielectric layer is exposed by the semiconductor substrate, and the sidewall of the first high-k gate dielectric layer is vertically aligned to a sidewall of the upper portion of the first metal gate electrode layer in a cross-sectional view of the memory device.

9. The memory device of claim 1, further comprising:

a first dielectric portion disposed over the recessed gate structure; and a second dielectric portion disposed over the planar gate structure, wherein a material of the first dielectric portion is the same as a material of the second dielectric portion;

wherein a top surface of the second dielectric portion is coplanar with a top surface of the first dielectric portion.

10. The memory device of claim 9, wherein the first dielectric portion is separated from the first high-k gate dielectric layer by the first metal gate electrode layer.

11. The memory device of claim 9, wherein a width of the first dielectric portion is substantially the same as a width of the first metal gate electrode layer above the top surface of the first high-k gate dielectric layer.

12. The memory device of claim 9, wherein a sidewall of the first dielectric portion is vertically aligned to a sidewall of the first metal gate electrode layer in a cross-sectional view of the memory device.

13. The memory device of claim 12, wherein a sidewall of the second high-k gate dielectric layer, a sidewall of the second metal gate electrode layer and a sidewall of the second dielectric portion are vertically aligned in the cross-sectional view of the memory device.

* * * * *